(12) United States Patent
Wu et al.

(10) Patent No.: US 12,046,677 B2
(45) Date of Patent: Jul. 23, 2024

(54) CONTACT FOR SEMICONDUCTOR DEVICE AND METHOD OF FORMING THEREOF

(71) Applicant: Taiwan Semiconductor Manufacturing Co., Ltd., Hsinchu (TW)

(72) Inventors: Huei-Shan Wu, Keelung (TW); Yi-Lii Huang, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/302,460

(22) Filed: Apr. 18, 2023

(65) Prior Publication Data

US 2023/0253501 A1    Aug. 10, 2023

Related U.S. Application Data

(63) Continuation of application No. 17/389,034, filed on Jul. 29, 2021, now Pat. No. 11,652,171.

(Continued)

(51) Int. Cl.
*H01L 29/78*    (2006.01)
*H01L 21/768*    (2006.01)
*H01L 21/8234*    (2006.01)
*H01L 23/522*    (2006.01)
*H01L 27/088*    (2006.01)
(Continued)

(52) U.S. Cl.
CPC .... *H01L 29/7851* (2013.01); *H01L 21/76805* (2013.01); *H01L 21/76814* (2013.01); *H01L 21/76829* (2013.01); *H01L 21/823431* (2013.01); *H01L 21/823456* (2013.01); *H01L 23/5226* (2013.01); *H01L 27/0886* (2013.01); *H01L 29/1033* (2013.01);
(Continued)

(58) Field of Classification Search
CPC ......... H01L 21/823475; H01L 23/5226; H01L 21/76805; H01L 21/76814; H01L 21/76829; H01L 29/7851; H01L 21/823431; H01L 21/823456; H01L 27/0886; H01L 29/1033; H01L 29/41791; H01L 29/66795; H01L 2029/7858
See application file for complete search history.

(56) References Cited

U.S. PATENT DOCUMENTS 9,105,490 B2    8/2015    Wang et al.
9,147,767 B2 *  9/2015    Chen ................ H01L 21/31116
(Continued)

FOREIGN PATENT DOCUMENTS

| CN | 113421850 A | 9/2021 |
|---|---|---|
| CN | 113451203 A | 9/2021 |
| DE | 102021109760 A1 | 8/2022 |

*Primary Examiner* — Earl N Taylor
(74) *Attorney, Agent, or Firm* — Slater Matsil, LLP

(57) ABSTRACT

A semiconductor device comprises a first gate electrode on a substrate, a first conductive contact on the first gate electrode, an etch stop layer (ESL) on the first conductive contact, and a second conductive contact extending through the ESL. The first conductive contact has a first width. The second conductive contact has a second width, the second width being smaller than the first width. The ESL overhangs a portion of the second conductive contact. A convex bottom surface of the second conductive contact physically contacts a concave top surface of the first conductive contact.

20 Claims, 40 Drawing Sheets

Related U.S. Application Data

(60) Provisional application No. 63/151,920, filed on Feb. 22, 2021.

(51) Int. Cl.
*H01L 29/10* (2006.01)
*H01L 29/417* (2006.01)
*H01L 29/66* (2006.01)

(52) U.S. Cl.
CPC .. *H01L 29/41791* (2013.01); *H01L 29/66795* (2013.01); *H01L 2029/7858* (2013.01)

(56) References Cited

U.S. PATENT DOCUMENTS

| | | | |
|---|---|---|---|
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,559,190 B2* | 1/2017 | Chen | H01L 29/7851 |
| 9,576,814 B2 | 2/2017 | Wu et al. | |
| 9,831,183 B2 | 11/2017 | Lin et al. | |
| 9,859,386 B2 | 1/2018 | Ho et al. | |
| 2015/0228793 A1* | 8/2015 | Chen | H01L 21/31116 438/586 |
| 2015/0364581 A1* | 12/2015 | Chen | H01L 21/76816 257/401 |
| 2020/0227425 A1* | 7/2020 | Lin | H01L 29/42324 |
| 2020/0395251 A1* | 12/2020 | Chiu | H01L 21/76847 |
| 2021/0225697 A1* | 7/2021 | Chen | H01L 23/5226 |
| 2021/0375630 A1* | 12/2021 | Hung | H01L 29/66545 |
| 2021/0375677 A1* | 12/2021 | Wang | H01L 27/0924 |
| 2022/0059405 A1* | 2/2022 | Chou | H01L 21/32133 |
| 2022/0115508 A1* | 4/2022 | Lin | H01L 27/0922 |
| 2022/0271163 A1* | 8/2022 | Wu | H01L 27/088 |
| 2023/0253501 A1* | 8/2023 | Wu | H01L 23/5226 257/288 |

* cited by examiner

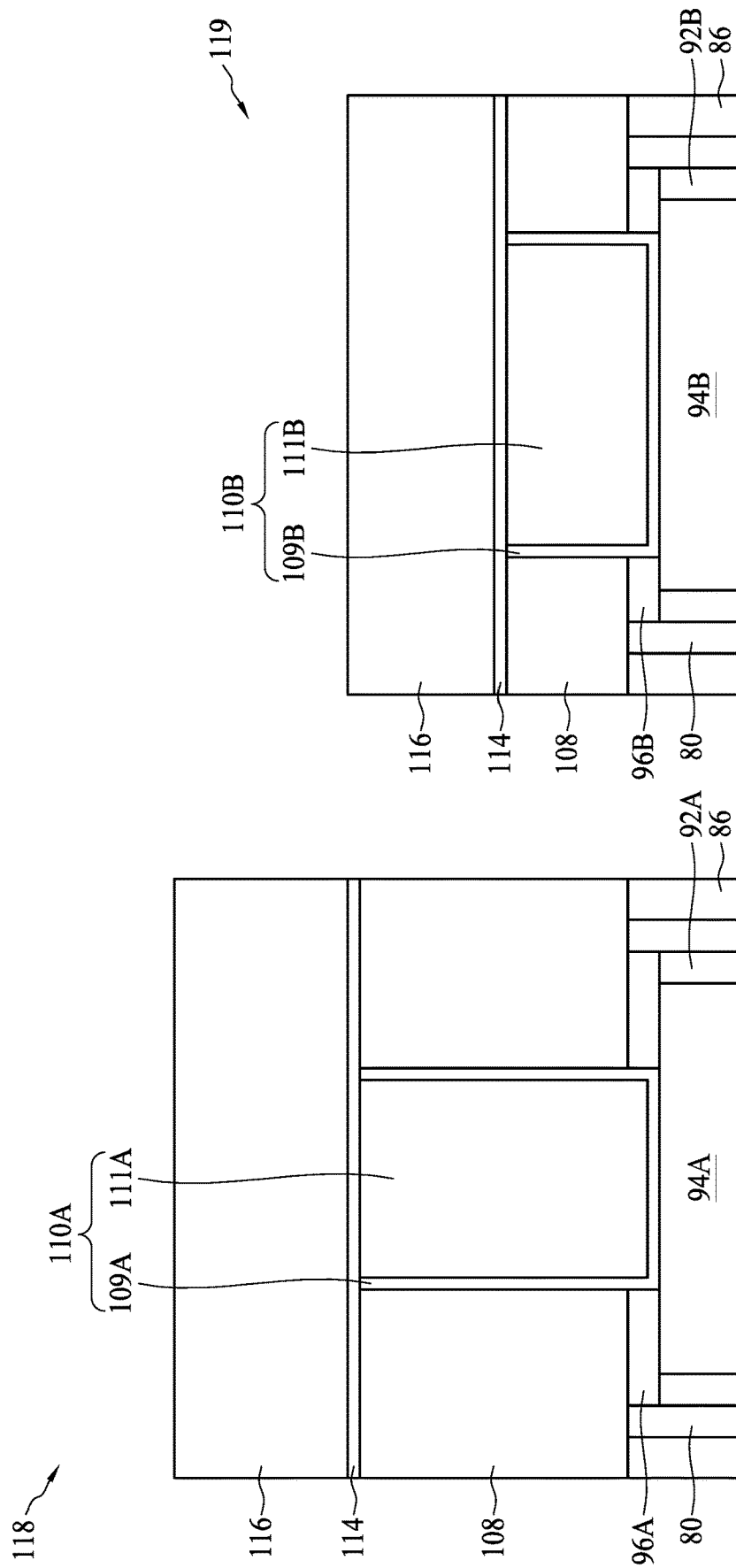

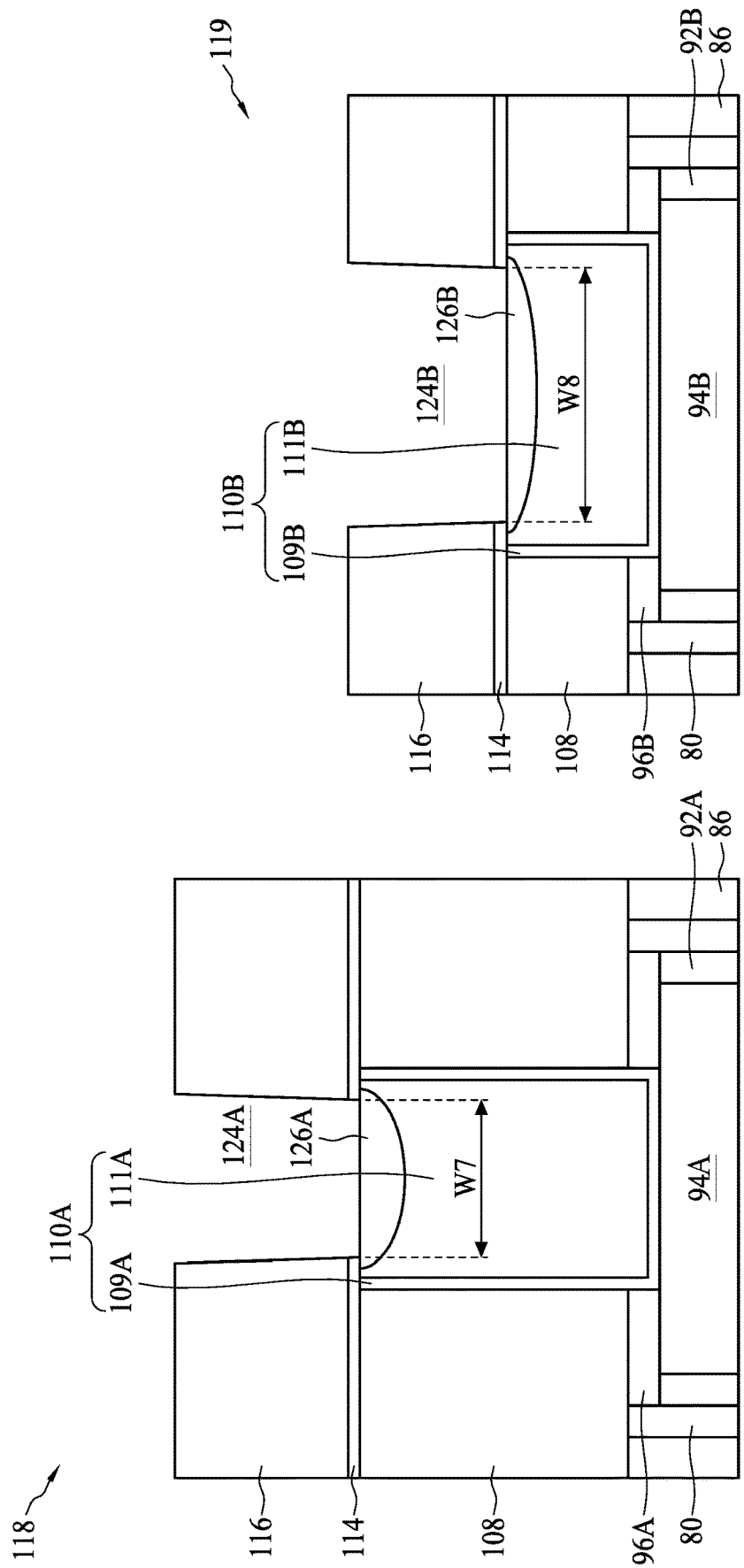

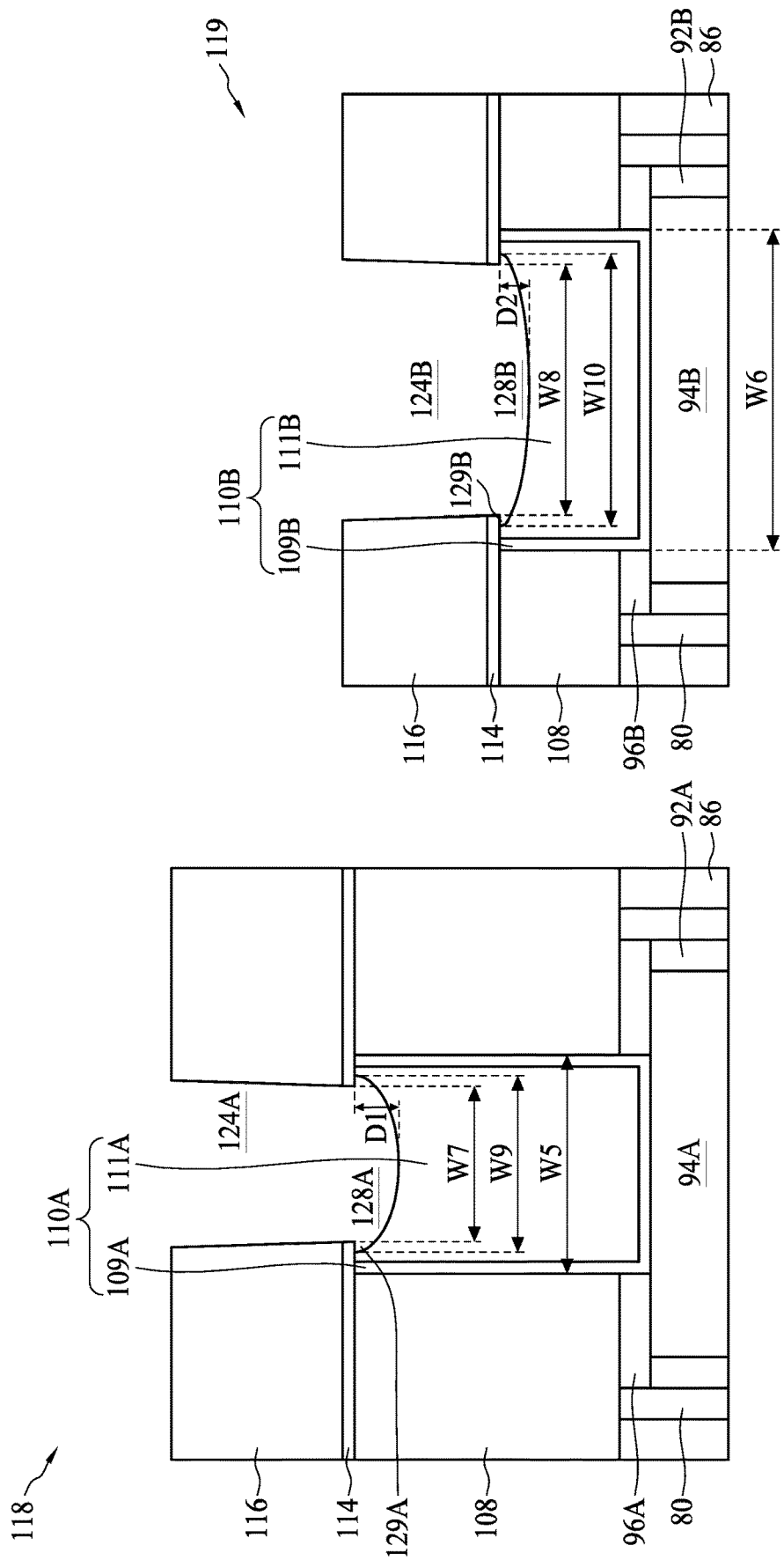

CONTACT FOR SEMICONDUCTOR DEVICE AND METHOD OF FORMING THEREOF

PRIORITY CLAIM AND CROSS-REFERENCE

This application is a continuation of U.S. application Ser. No. 17/389,034, filed on Jul. 29, 2021, which claims the benefit of U.S. Provisional Application No. 63/151,920, filed on Feb. 22, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7A, 7B, 8A, 8B, 9A, 9B, 10A, 10B, 10C, 10D, 11A, 11B, 12A, 12B, 13A, 13B, 14A, 14B, 14C, 15A, 15B, 16A, 16B, 16C, 16D, 17A, 17B, 17C, 17D, 18A, 18B, 19A, 19B, 20A, and 20B are cross-sectional views of intermediate stages in the manufacturing of FinFETs, in accordance with some embodiments.

DETAILED DESCRIPTION

Figure 1:
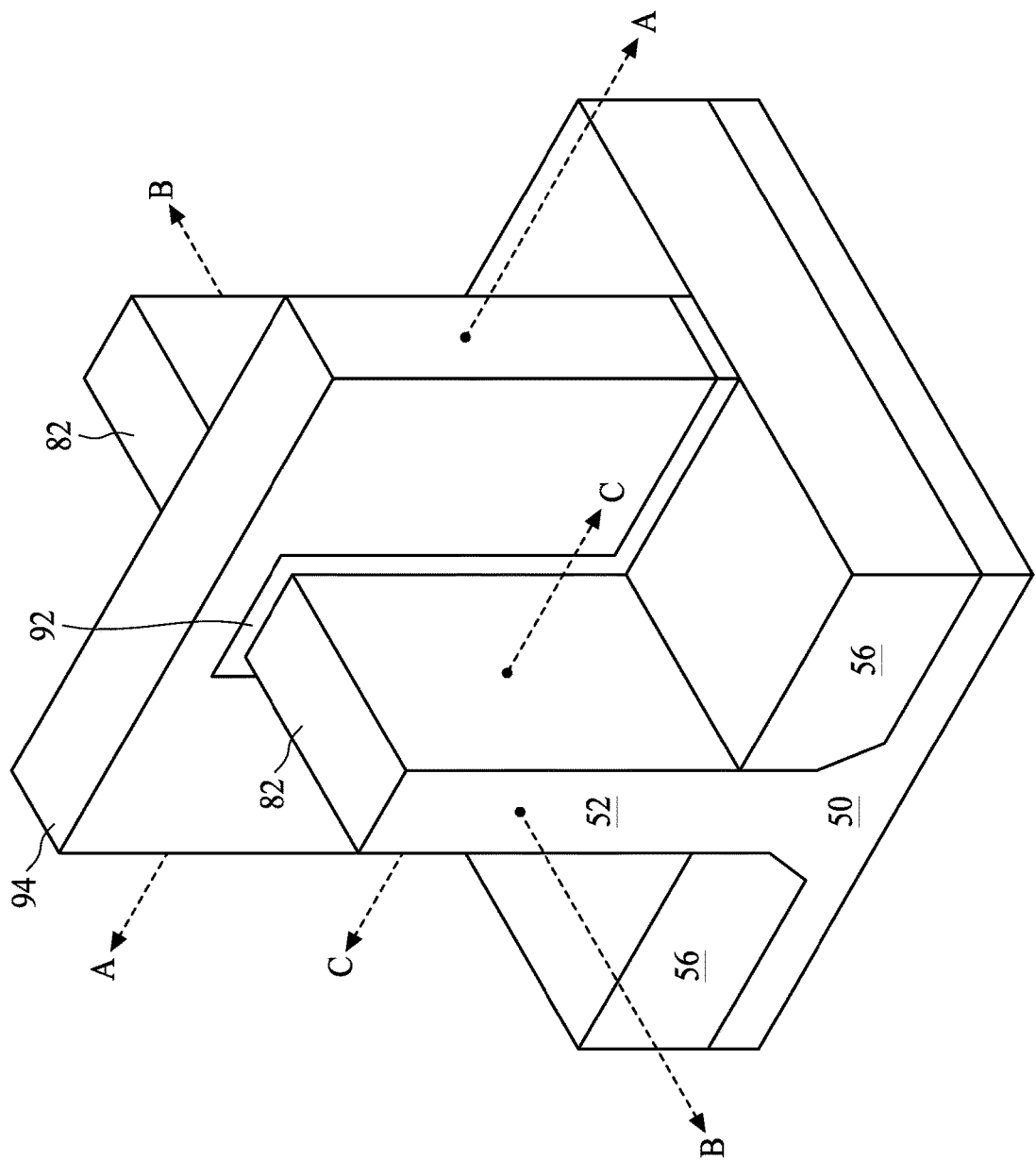
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interconnect structure of a semiconductor device and a method of forming the same are provided, in accordance with some embodiments. In some embodiments, a gate contact is formed on a gate structure. A contact plug is subsequently formed on the gate contact. The contact plug has a smaller width than the gate contact, and a bottom portion of the contact plug comprising a rivet shape extends below a top surface of the gate contact. The rivet shape of the bottom portion of the contact plug may be useful for reducing undesirable etching of the gate contact by slurry from a CMP performed on the contact plug. The gate contact having a larger width than the contact plug may be useful for allowing the rivet shape of the bottom portion of the contact plug to be wider and shallower, which can reduce undesirable contact resistance and improve yield gain for high bandwidth memory.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 20B are cross-sectional views of intermediate stages in the manufacturing of FinFETs, in accordance with some embodiments. FIGS. 2 through 7B illustrate reference cross-section A-A illustrated in FIG. 1, except for multiple fins/FinFETs. FIGS. 8A, 9A, 10A, 11A, 12A, 13A, 14A, 15A, 16A, and 17A are illustrated along reference cross-section A-A illustrated in FIG. 1, and FIGS. 8B, 9B, 10B, 11B, 12B, 13B, 14B, 14C, 15B, 16B, 16C, 16D, 17B, 17C, 17D, 18A, 18B, 19A, 19B, 20A, and 20B are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
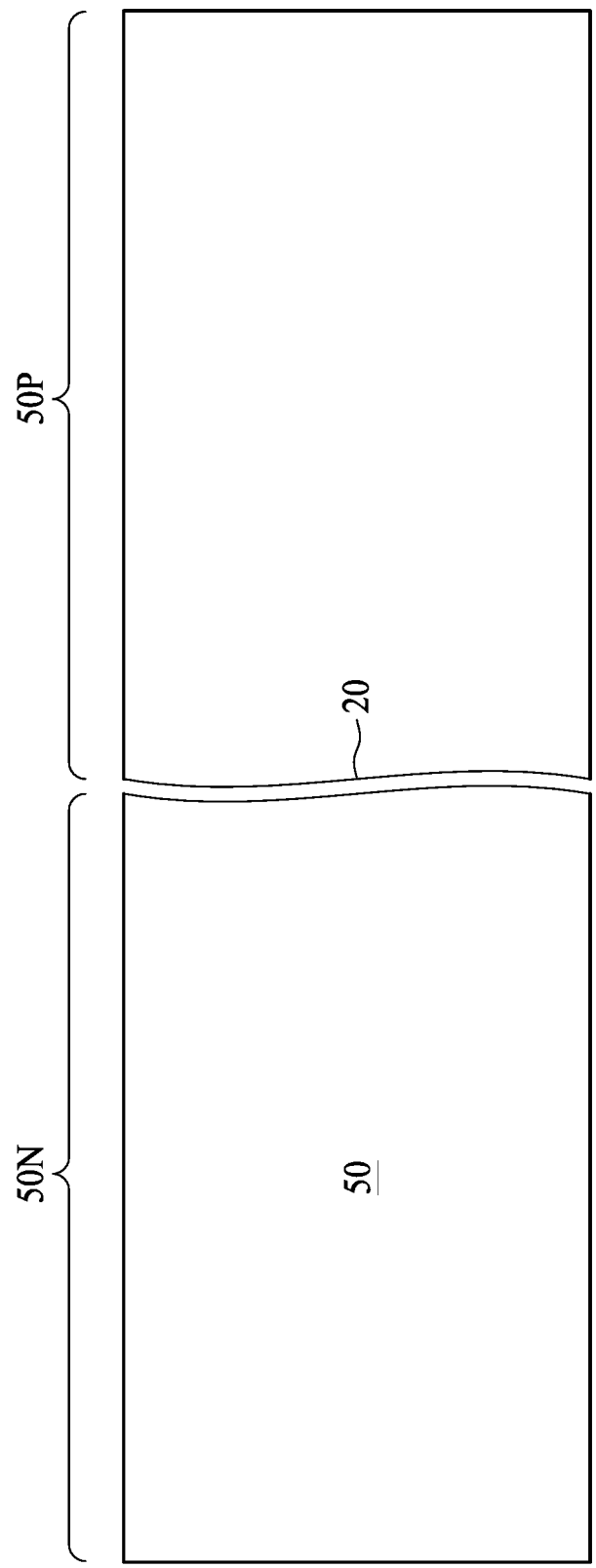

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P.

Figure 3:
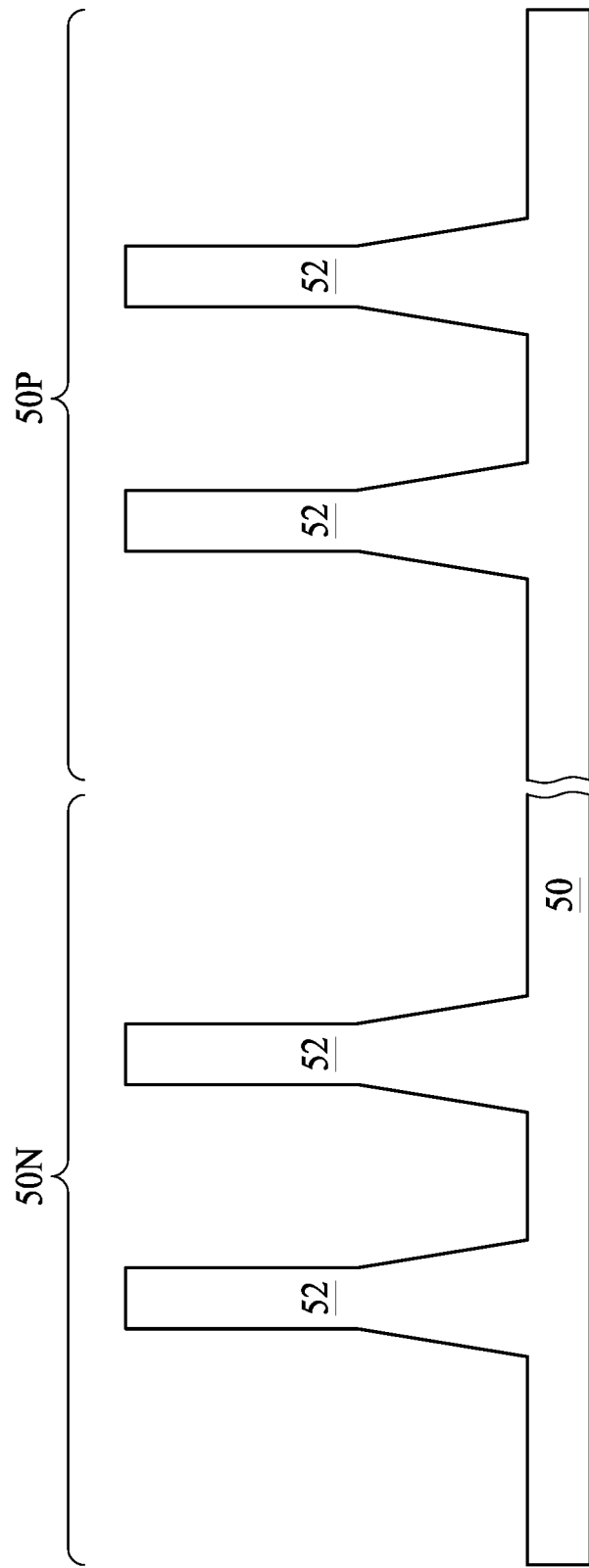

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
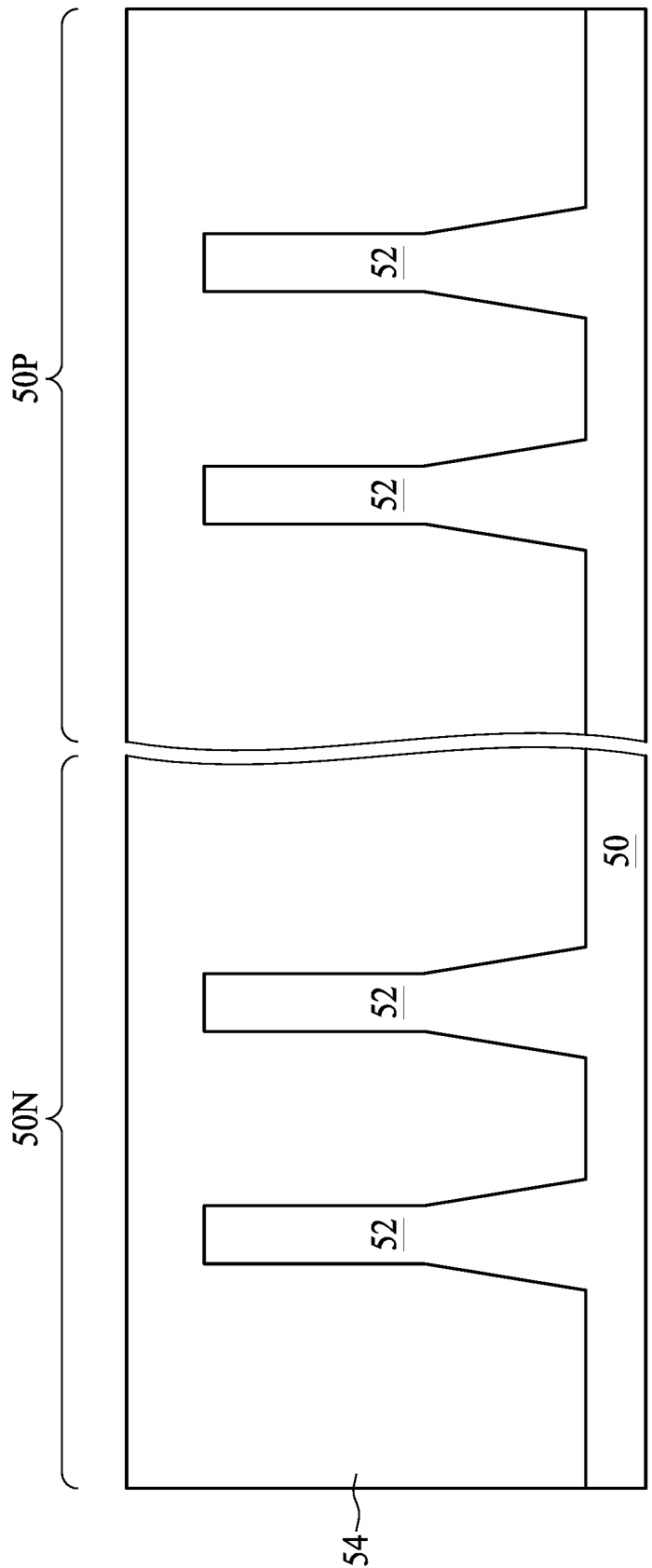

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FC VD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
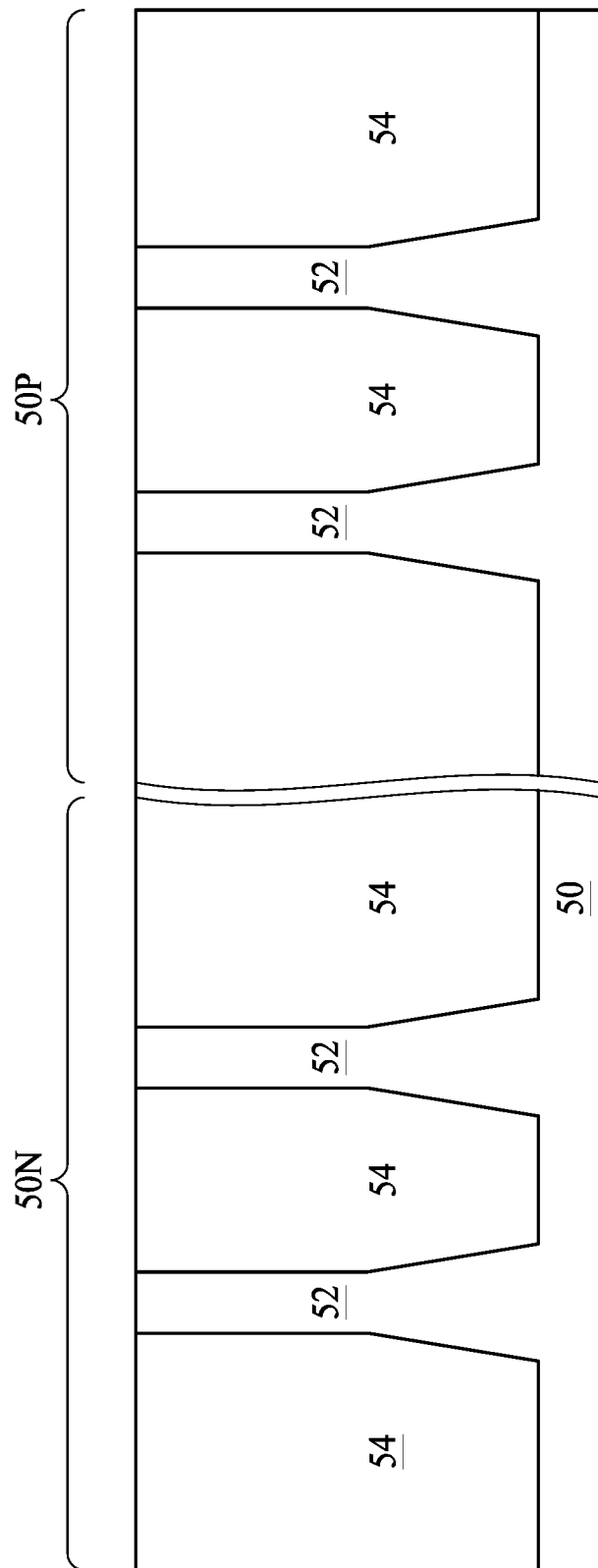

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
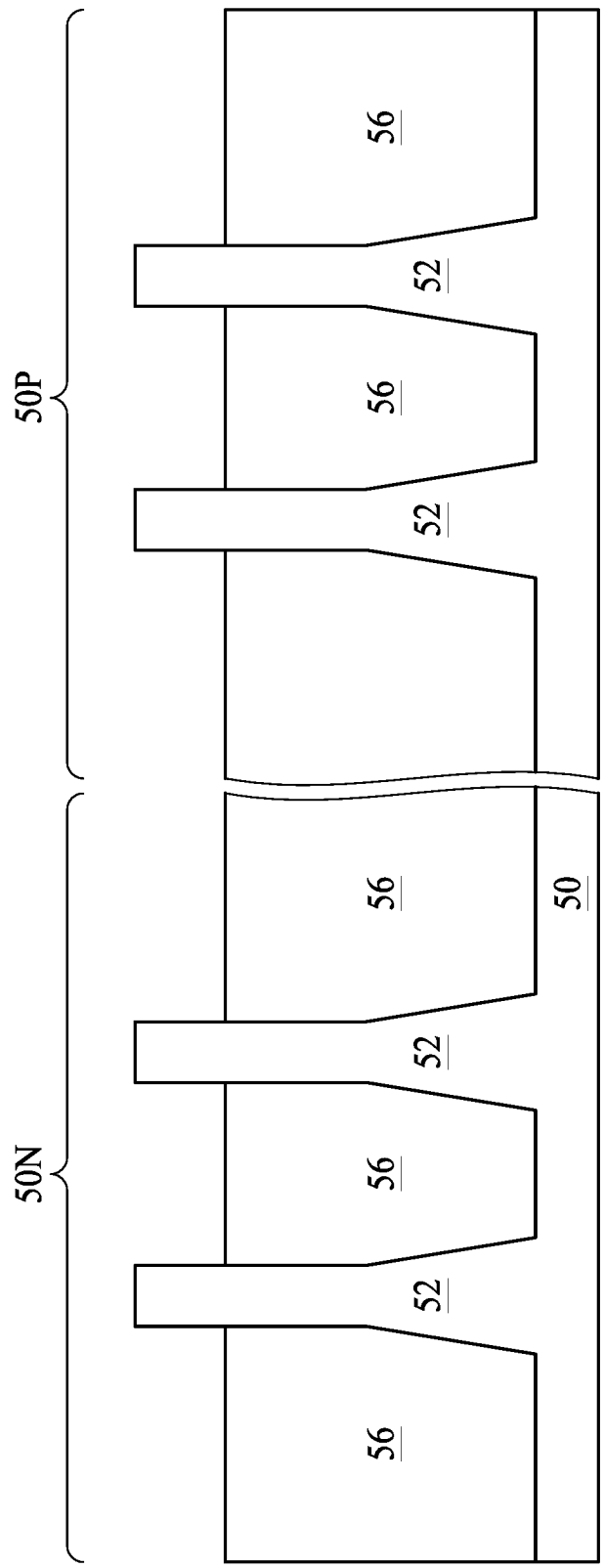

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7A:
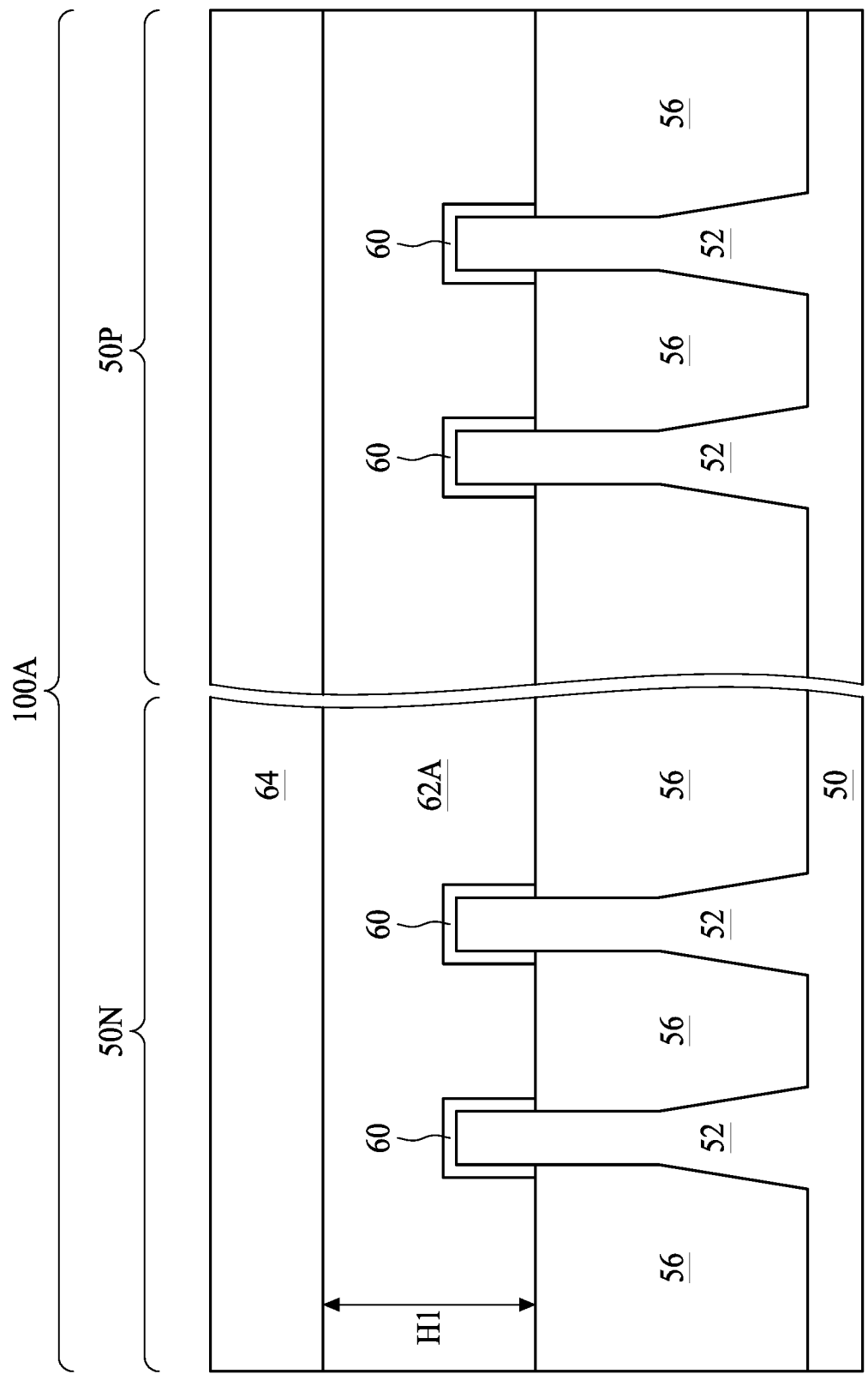
Figure 7B:
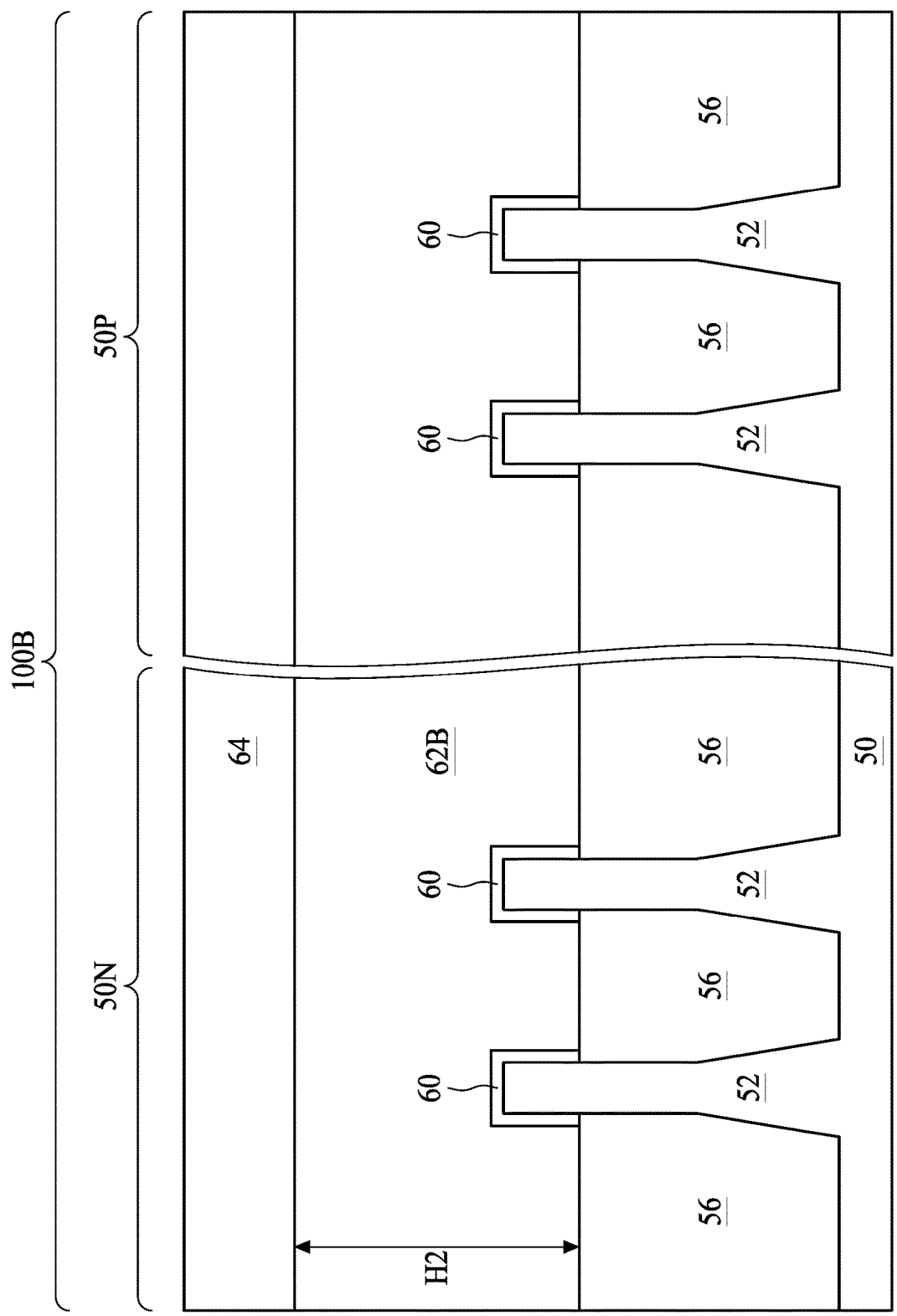

In FIGS. 7A and 7B, layers for forming dummy gates are formed on the fins 52. FIG. 7A illustrates a first gate area 100A in which relatively smaller gate structures may subsequently be formed (see below, FIG. 14B) and FIG. 7B illustrates a second gate area 100B in which relatively larger gate structures may subsequently be formed (see below, FIG. 14B). Differences in the sizes of the subsequently formed gate structures may be due to, e.g., loading effects or dishing effects of CMPs in areas with different pattern densities. The first gate area 100A and the second gate area 100B may be physically separated. The first gate area 100A and the second gate area 100B may each contain respective n-type regions 50N and p-type regions 50P.

Referring to FIGS. 7A and 7B, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between subsequently formed dummy gate layers (see below) and the STI regions 56.

Still referring to FIGS. 7A and 7B, a dummy gate layer 62A is formed over the dummy dielectric layer 60 in the first gate area 100A and a dummy gate layer 62B is formed over the dummy dielectric layer 60 in the second gate area 100B. The dummy gate layers 62A and 62B may be deposited over the dummy dielectric layer 60 and then planarized, such as by respective CMP processes. In some embodiments, the dummy gate layer 62A is formed and planarized to a height H1 in a range of 110 nm to 130 nm and the dummy gate layer 62B is formed and planarized to a height H2 in a range of 110 nm to 130 nm. In other embodiments, the dummy gate layer 62A and 62B are formed to about the same height. The dummy gate layers 62A and 62B may be a conductive or non-conductive material and may be selected from a group including amorphous silicon, polycrystalline-silicon (poly-silicon), poly-crystalline silicon-germanium (poly-SiGe), metallic nitrides, metallic silicides, metallic oxides, and metals. The dummy gate layers 62A and 62B may be deposited by physical vapor deposition (PVD), CVD, sputter deposition, or other techniques for depositing the selected material. The dummy gate layers 62A and 62B may be made of other materials that have a high etching selectivity from the etching of isolation regions, e.g., the STI regions 56 and/or the dummy dielectric layer 60.

Further referring to FIGS. 7A and 7B, a mask layer 64 is formed over the dummy gate layers 62A and 62B. The mask layer 64 may include one or more layers of, for example, silicon nitride, silicon oxynitride, or the like. In this example, a single mask layer 64 are formed across the n-type region 50N and the p-type region 50P. In some embodiments, the mask layer 64 may be formed to different thicknesses in the first gate area 100A and the second gate area 100B.

FIGS. 8A through 20F illustrate various additional steps in the manufacturing of embodiment devices. FIGS. 8A through 20F illustrate features in either of the n-type region 50N and the p-type region 50P. For example, the structures illustrated in FIGS. 8A through 20F may be applicable to both the n-type region 50N and the p-type region 50P. Differences (if any) in the structures of the n-type region 50N and the p-type region 50P are described in the text accompanying each figure. FIGS. 8A, 9A, 10A, 10C, 10D, 11A, 12A, 13A, 14A, 15A, 16A, and 17A illustrate features in the first gate area 100A and the second gate area 100B, as the structures illustrated in FIGS. 8A, 9A, 10A, 11A, 12A, 13A, 14A, 15A, 16A, and 17A may be applicable to both the first gate area 100A and the second gate area 100B. Differences (if any) in the structures of the first gate area 100A and the second gate area 100B are described in the text accompanying each figure. FIGS. 8B, 9B, 10B, 11B, 12B, 13B, 14B, 15B, 16B, and 17B illustrate the first gate area 100A and the second gate area 100B separated by a divider 22.

Figure 8A:
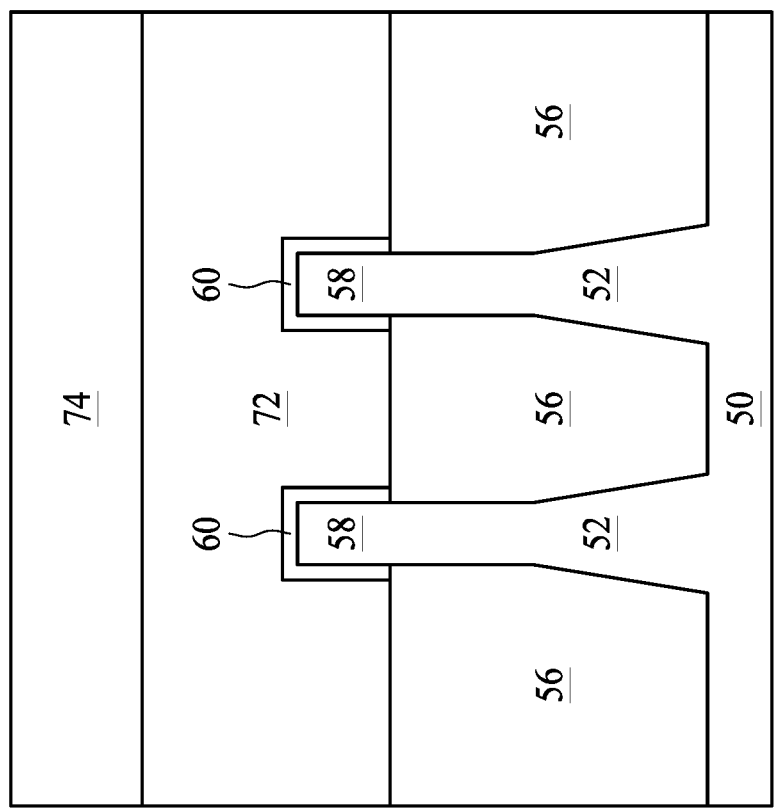
Figure 8B:
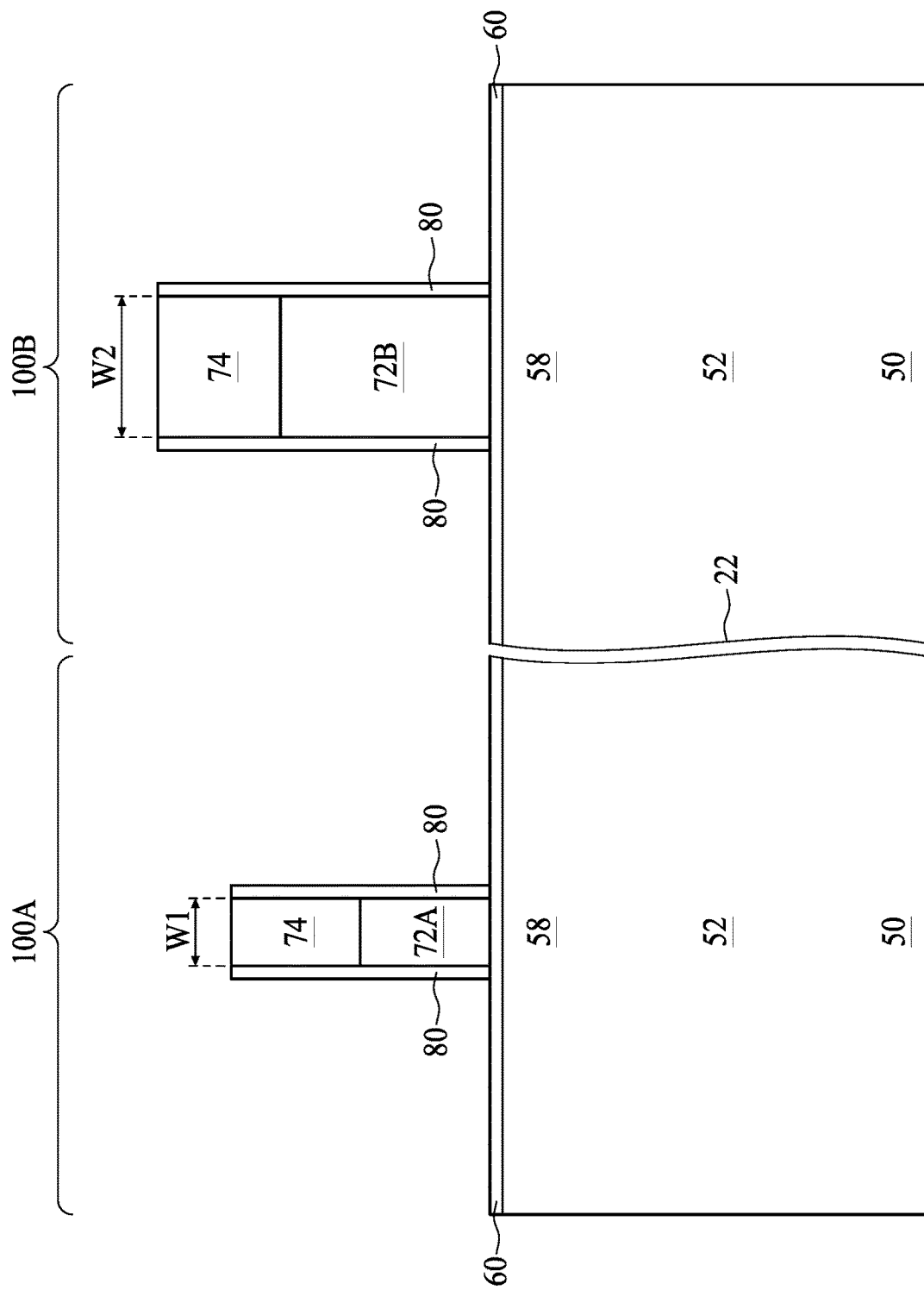

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72A and 72B in the first gate area 100A and the second gate area 100B, respectively. The dummy gates 72A and 72B may be collectively be referred to as dummy gates 72, as illustrated in FIG. 8A and subsequent figures following from FIG. 8A. The dummy gates 72A and 72B cover respective channel regions 58 of the fins 52. The pattern of the masks 74 may be used to physically separate each of the dummy gates 72A and 72B from adjacent dummy gates. The dummy gates 72A and 72B may also have a lengthwise direction substantially perpendicular to the lengthwise direction of respective epitaxial fins 52. In some embodiments, the dummy gates 72A are patterned to have widths W1 in a range of 8 nm to 36 nm and the dummy gates 72B are patterned to have widths W2 in a range of 72 nm to 240 nm.

Further in FIGS. 8A and 8B, gate seal spacers 80 can be formed on exposed surfaces of the dummy gates 72A and 72B, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9A:
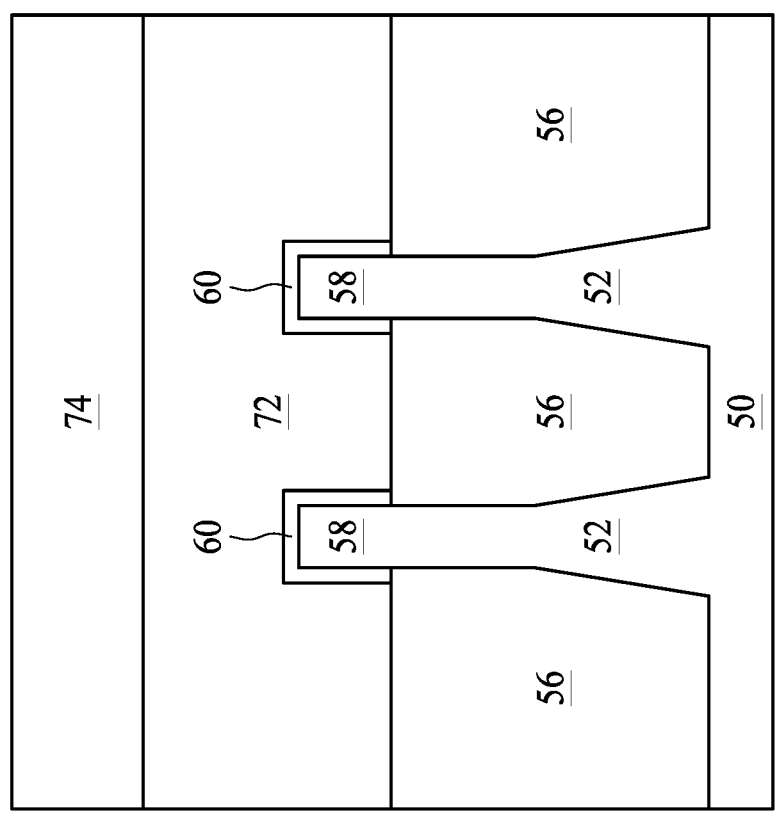
Figure 9B:
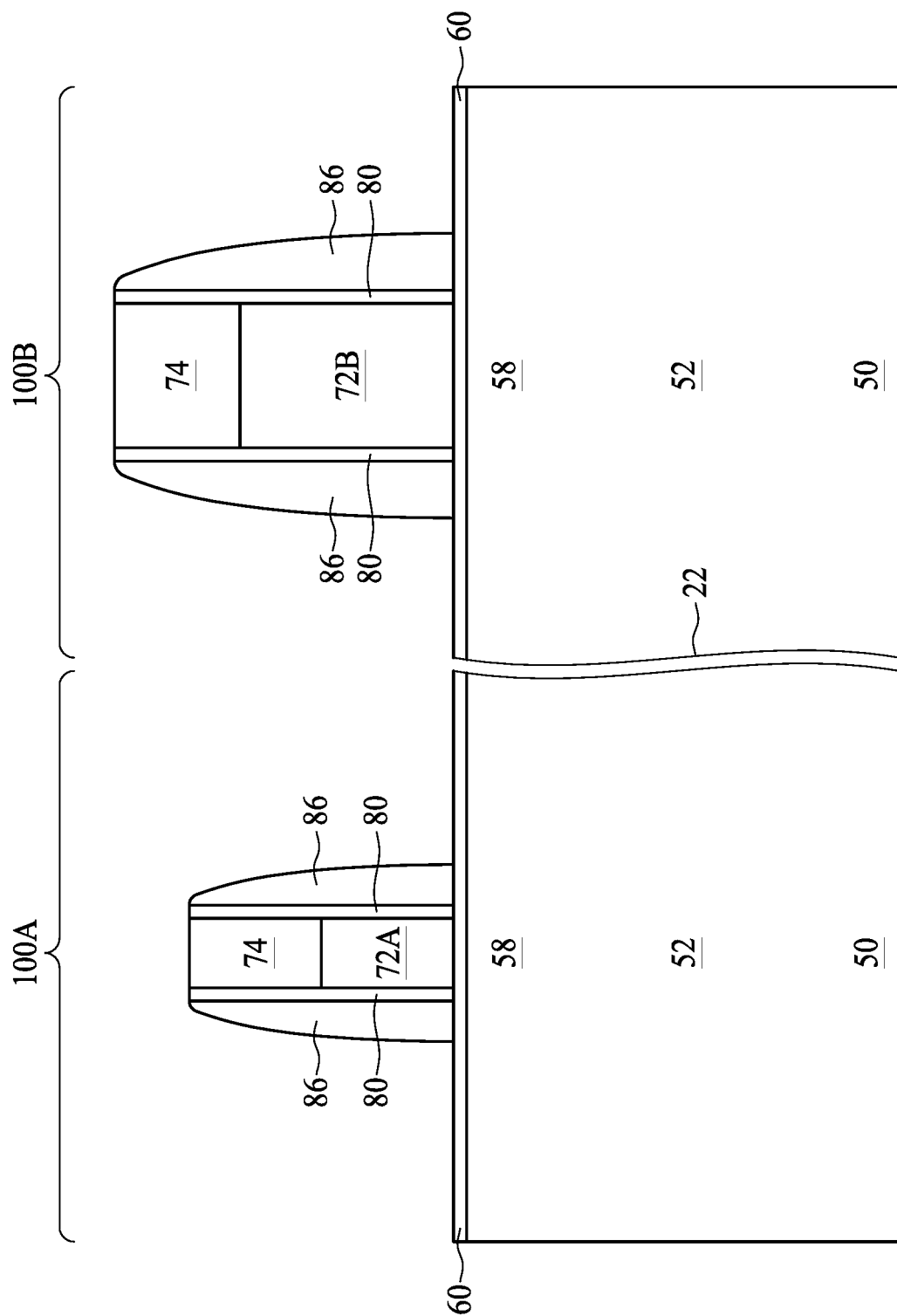

In FIGS. 9A and 9B, gate spacers 86 are formed on the gate seal spacers 80 along sidewalls of the dummy gates 72A and 72B and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers), spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10A:
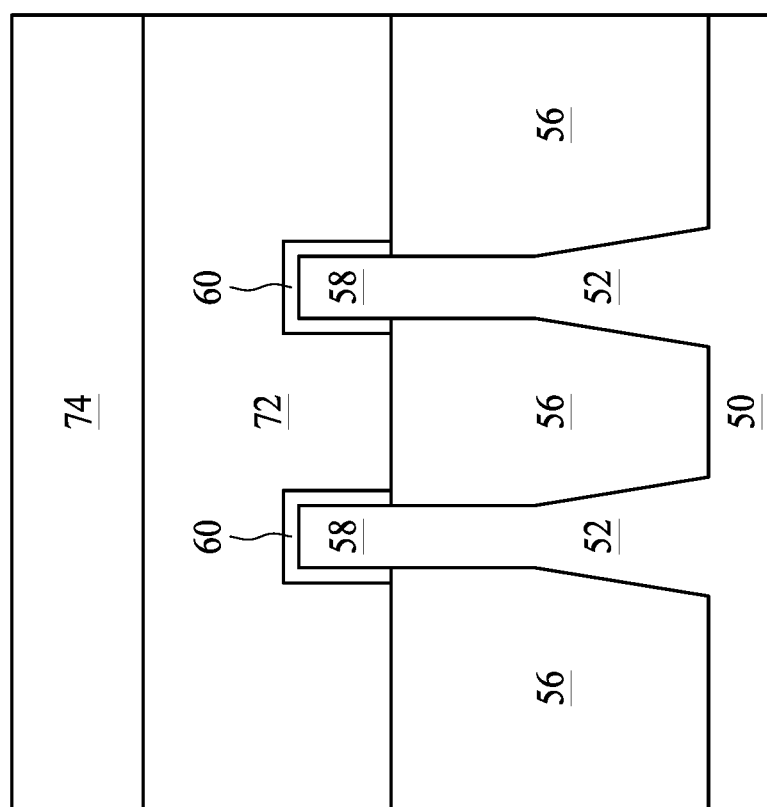
Figure 10B:
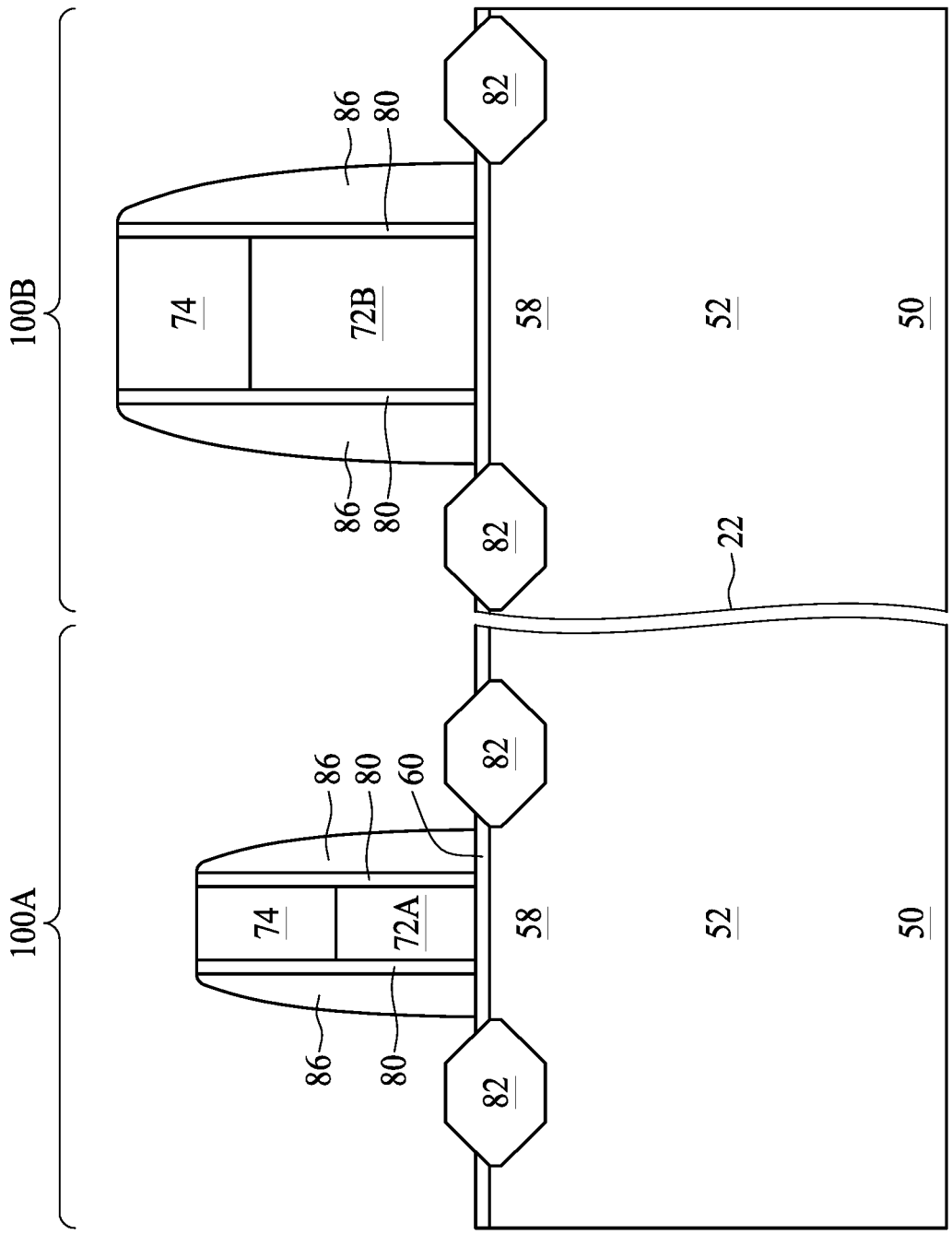
Figure 10C:
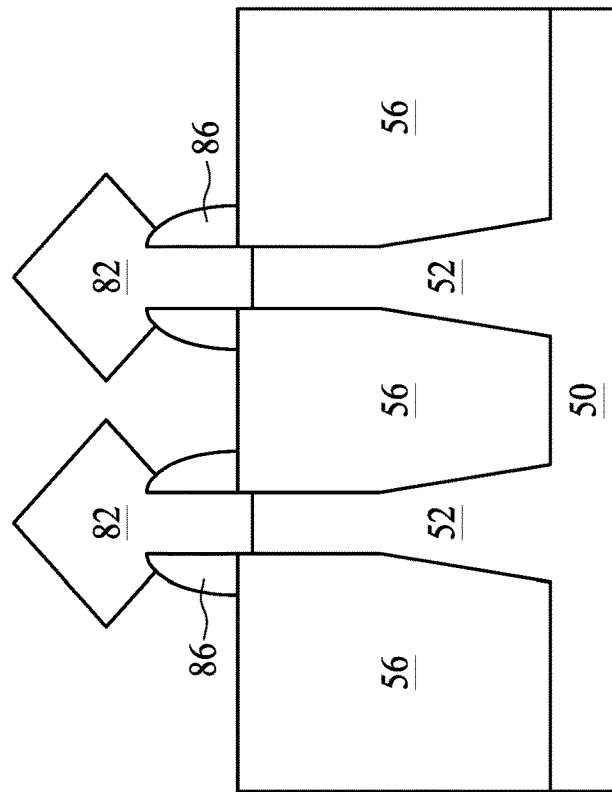
Figure 10D:
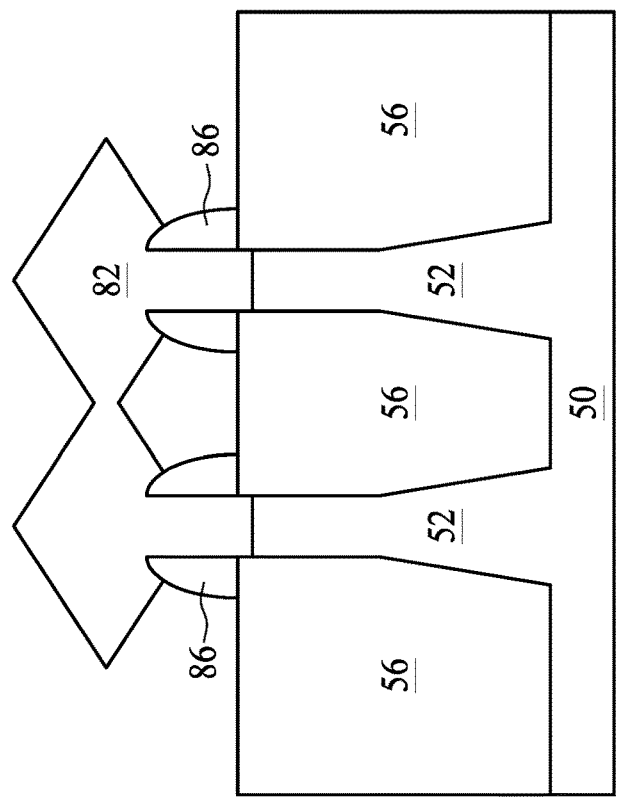

In FIGS. 10A and 10B epitaxial source/drain regions 82 are formed in the fins 52. The epitaxial source/drain regions 82 are formed in the fins 52 such that each dummy gate 72A and 72B is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72A and 72B by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11A:
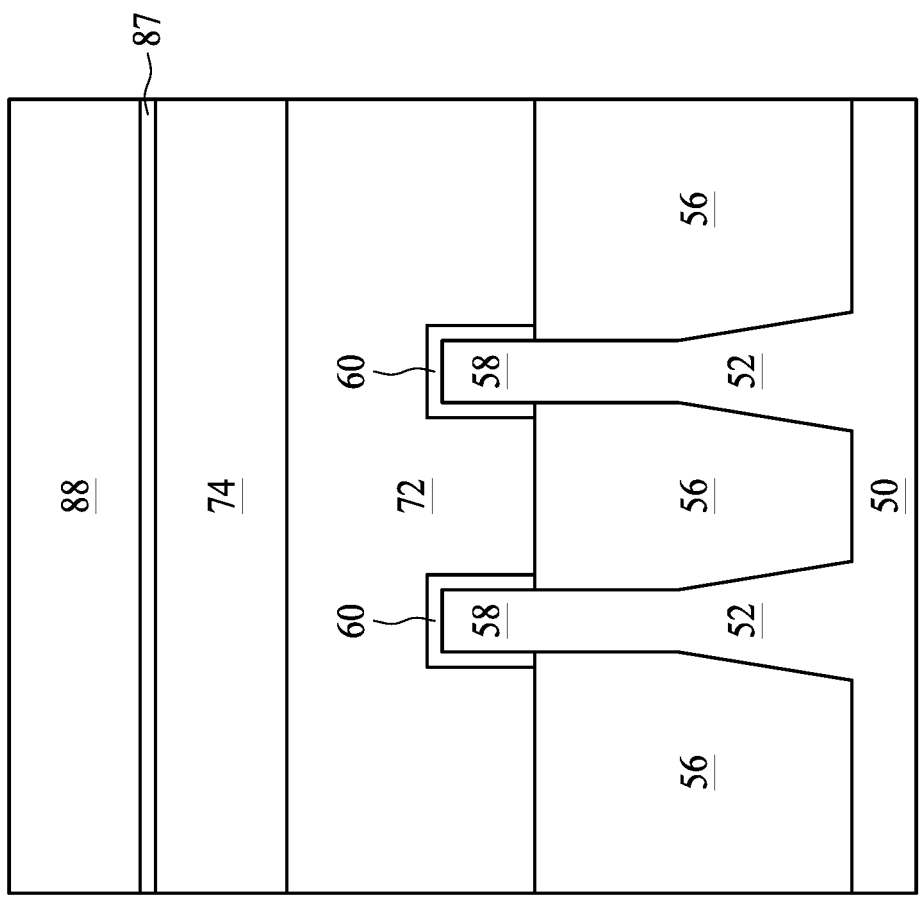
Figure 11B:
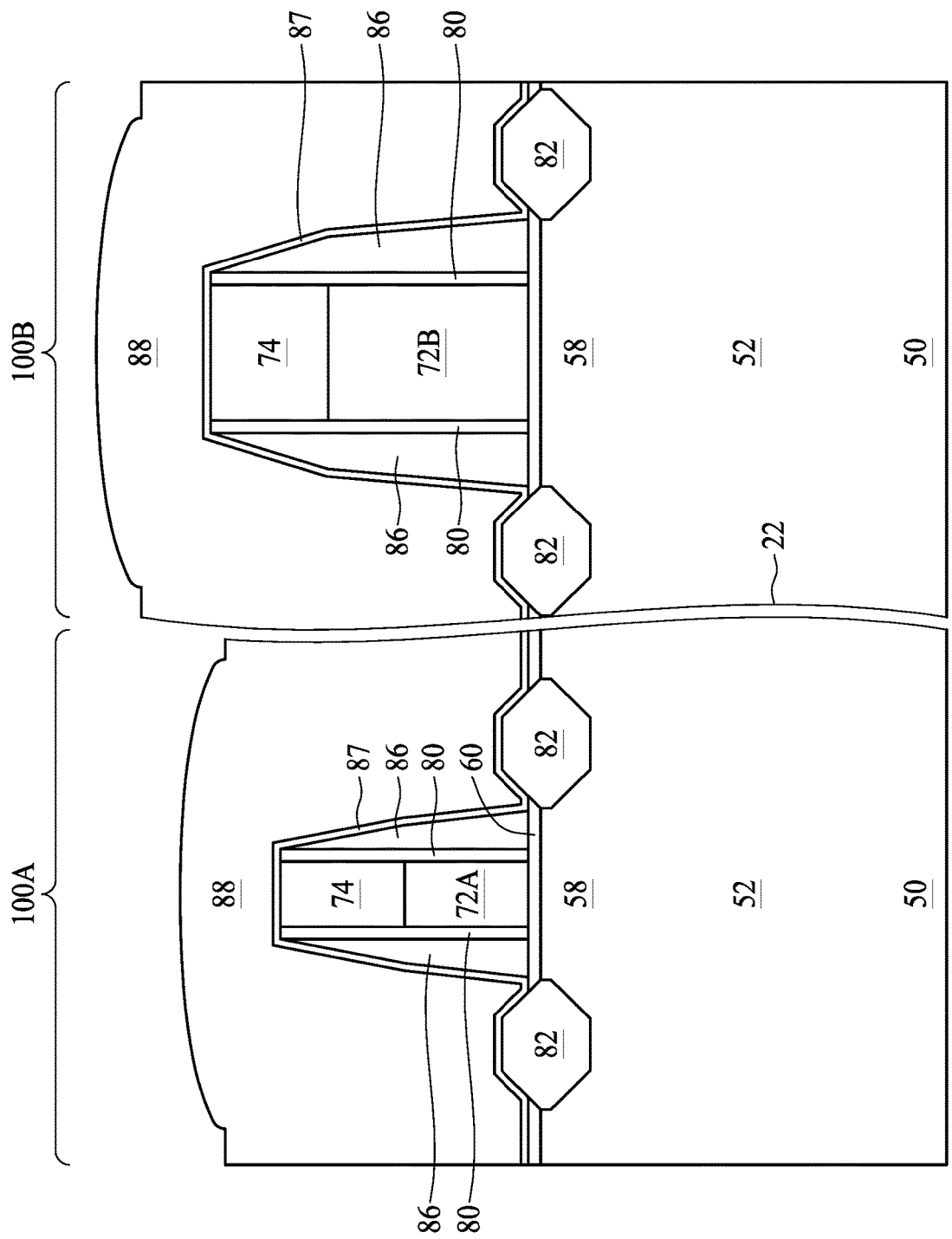

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a first contact etch stop layer (CESL) 87 is disposed between the first ILD 88 and the epitaxial source/drain regions 82, the masks 74, and the gate spacers 86. The first CESL 87 may comprise a dielectric material, such as silicon nitride, silicon oxide, silicon oxynitride, or the like, having a lower etch rate than the material of the overlying first ILD 88.

Figure 12A:
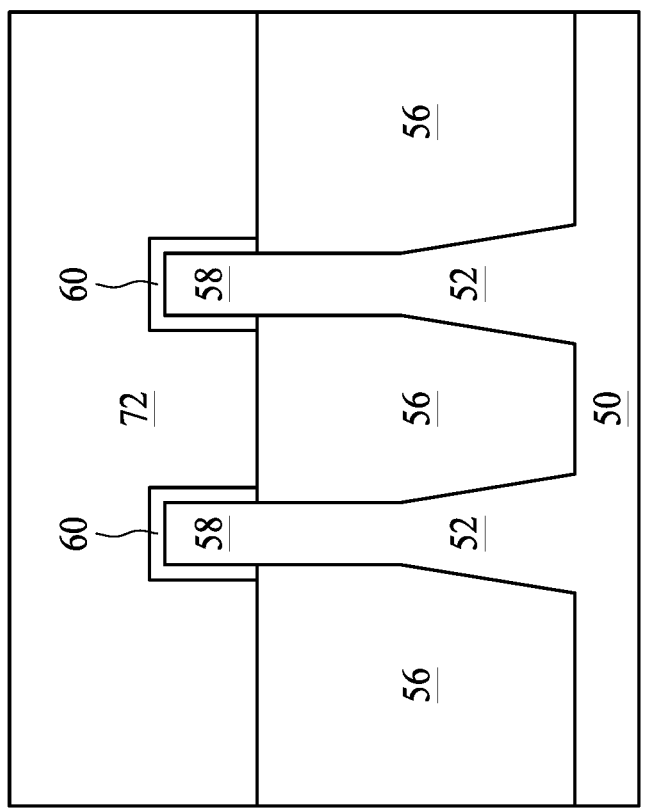
Figure 12B:
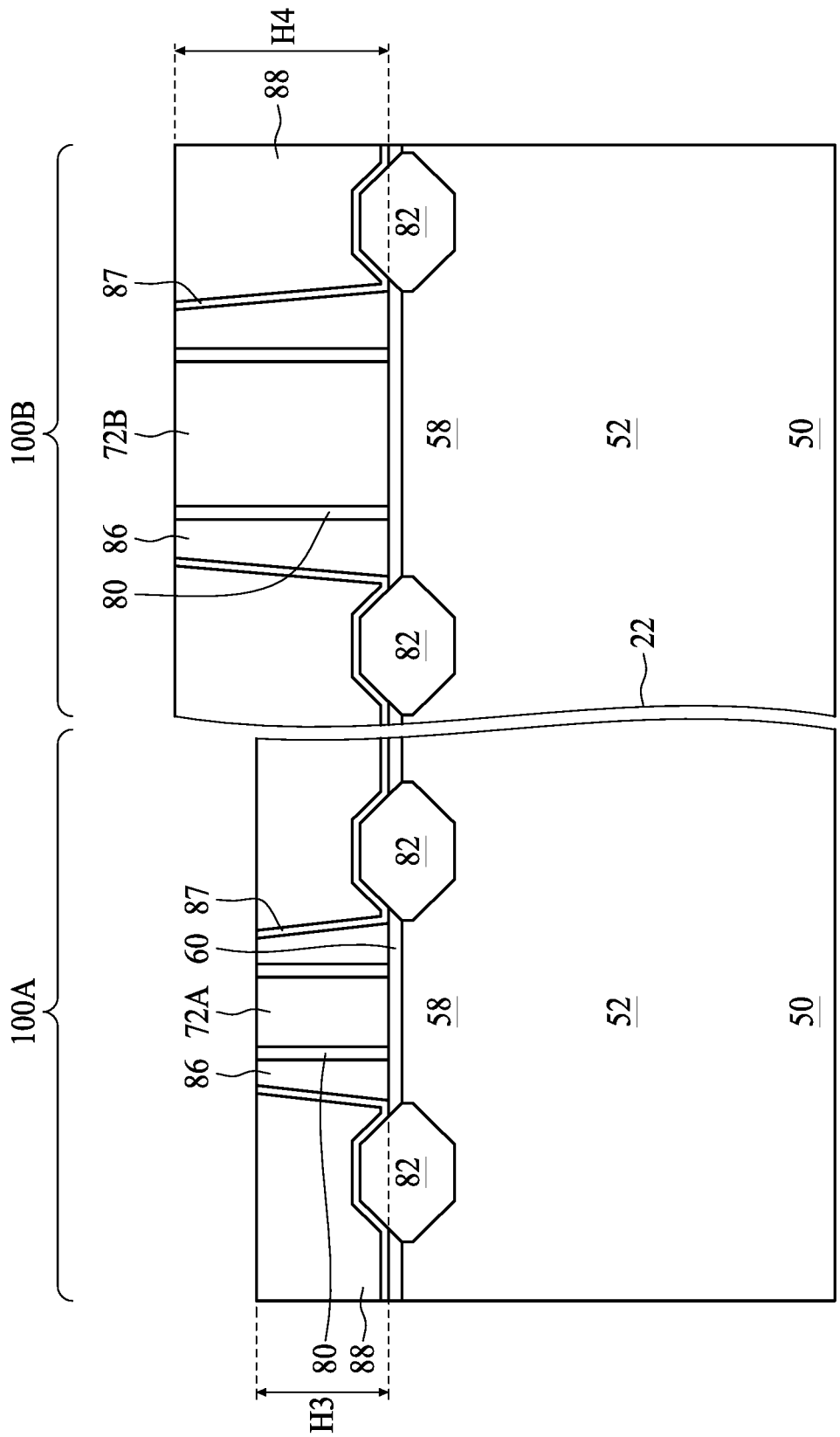

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

After the planarization, the dummy gate 72A may have a height H3 in a range of 15 nm to 19 nm and the dummy gate 72B may have a height H4 in a range of 18 nm to 28 nm. In some embodiments, the dummy gates 72A and 72B have a similar height before the planarization and the height H4 of the dummy gates 72B is greater than the height H3 of the dummy gates 72A after the planarization, which may be due to e.g. larger dishing effects on the dummy gates 72A such as from greater pattern density.

Figure 13A:
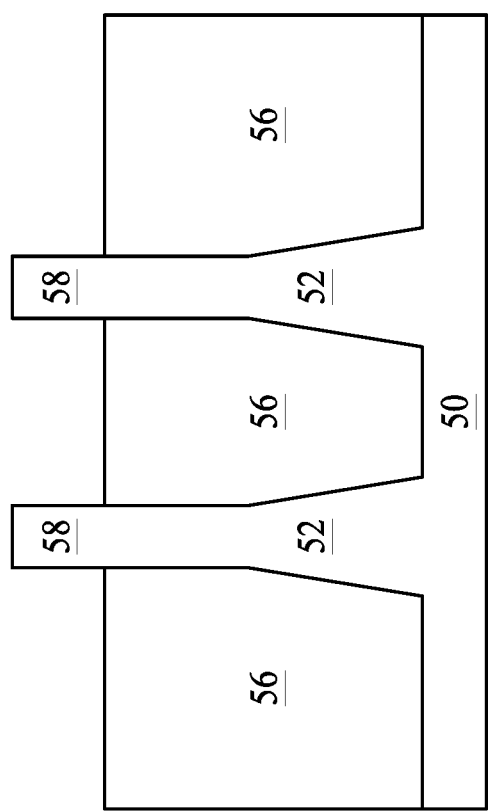
Figure 13B:
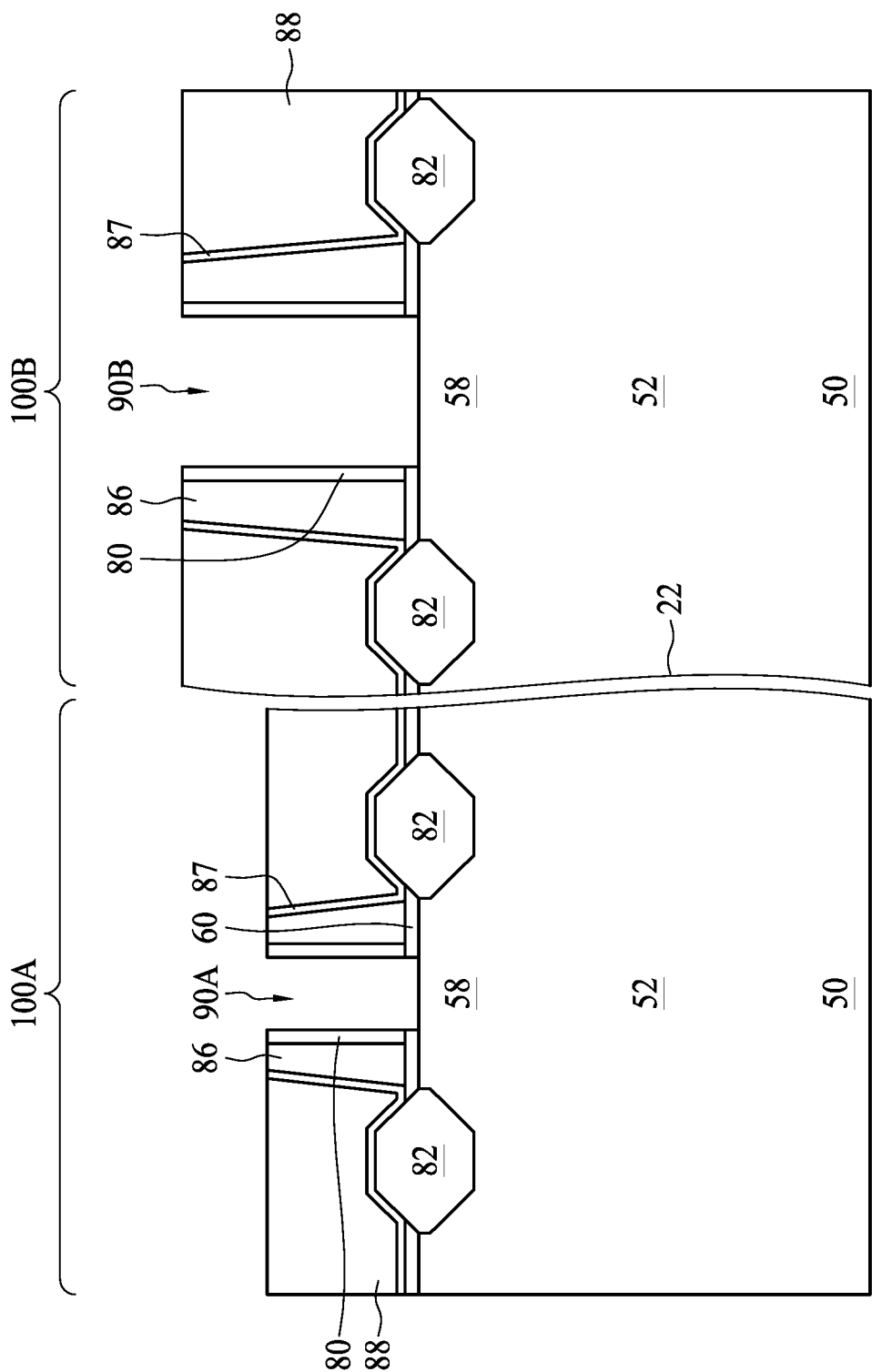

In FIGS. 13A and 13B, the dummy gates 72A and 72B, and the masks 74 if present, are removed in an etching step(s), so that recesses 90A and 90B are formed. Portions of the dummy dielectric layer 60 in the recesses 90A and 90B may also be removed. In some embodiments, only the dummy gates 72A and 72B are removed and the dummy dielectric layer 60 remains and is exposed by the recesses 90A and 90B. In some embodiments, the dummy dielectric layer 60 is removed from recesses 90A and 90B in a first region of a die (e.g., a core logic region) and remains in recesses 90A and 90B in a second region of the die (e.g., an input/output region). In some embodiments, the dummy gates 72A and 72B are removed by an anisotropic dry etch process. For example, the etching process may include a dry etch process using reaction gas(es) that selectively etch the dummy gates 72A and 72B with little or no etching of the first ILD 88 or the gate spacers 86. Each recess 90A and 90B exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72A and 72B are etched. The dummy dielectric layer 60 may then be optionally removed after the removal of the dummy gates 72A and 72B.

Figure 14A:
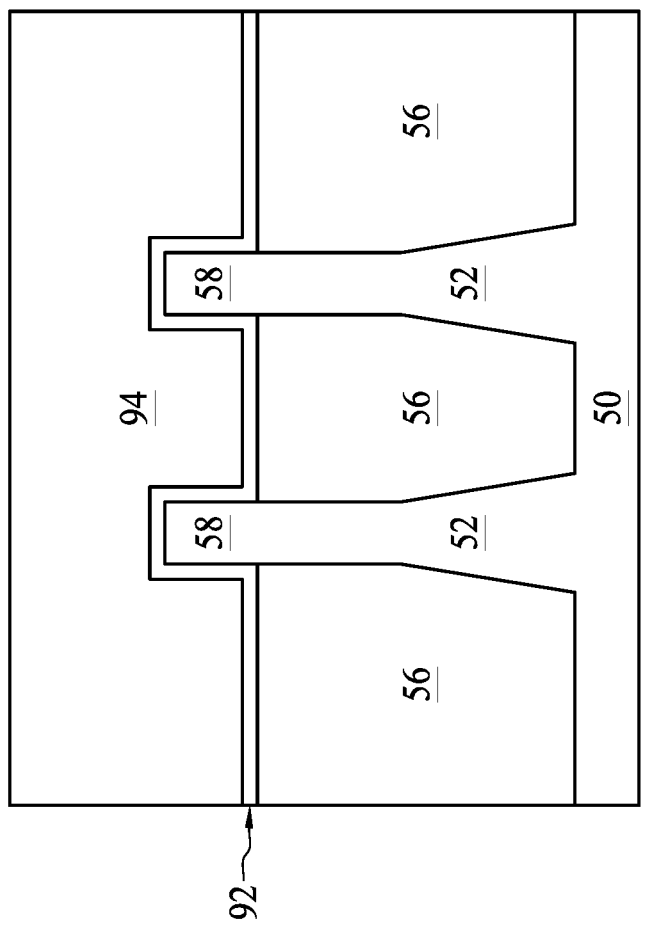
Figure 14B:
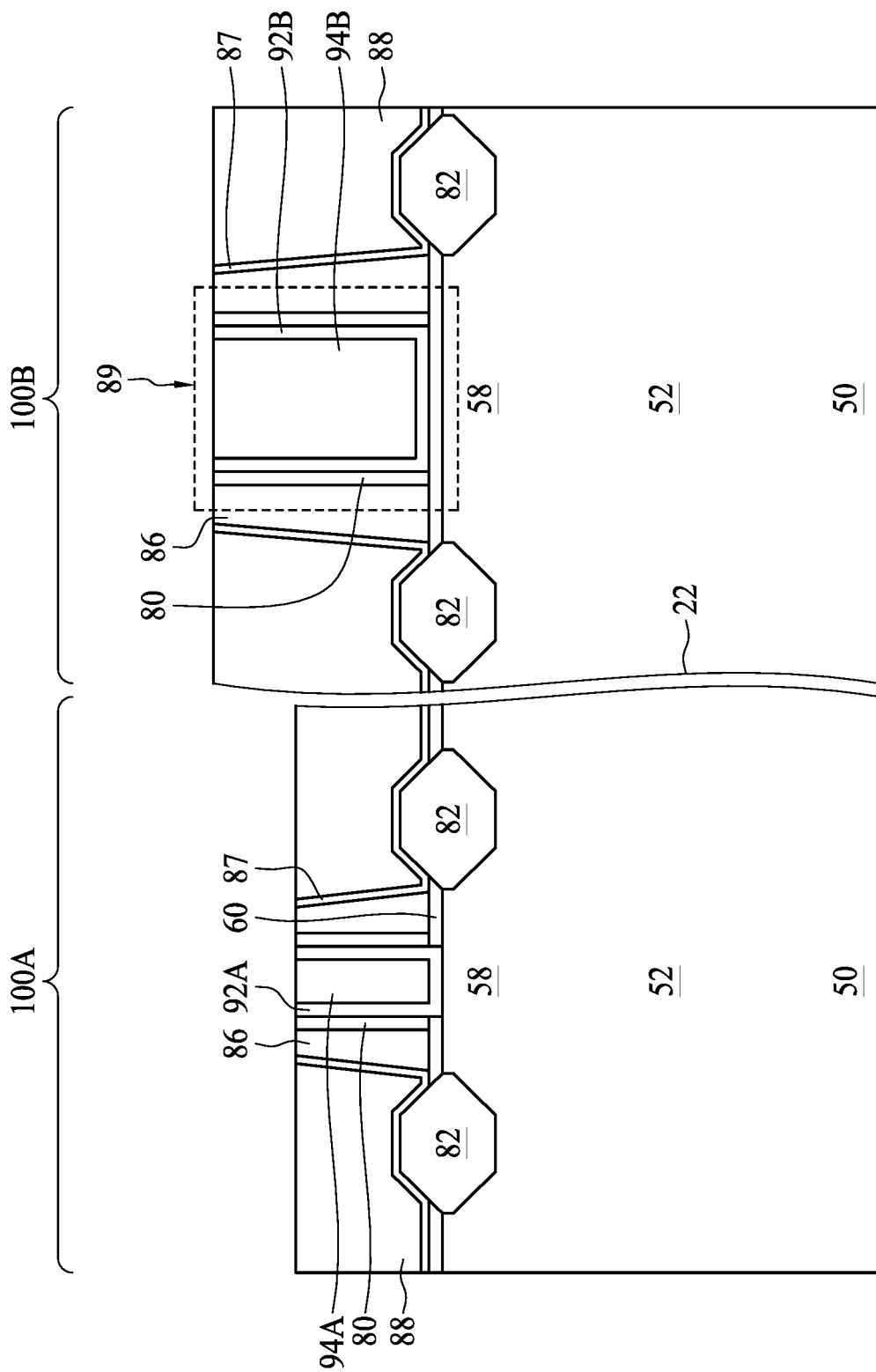
Figure 14C:
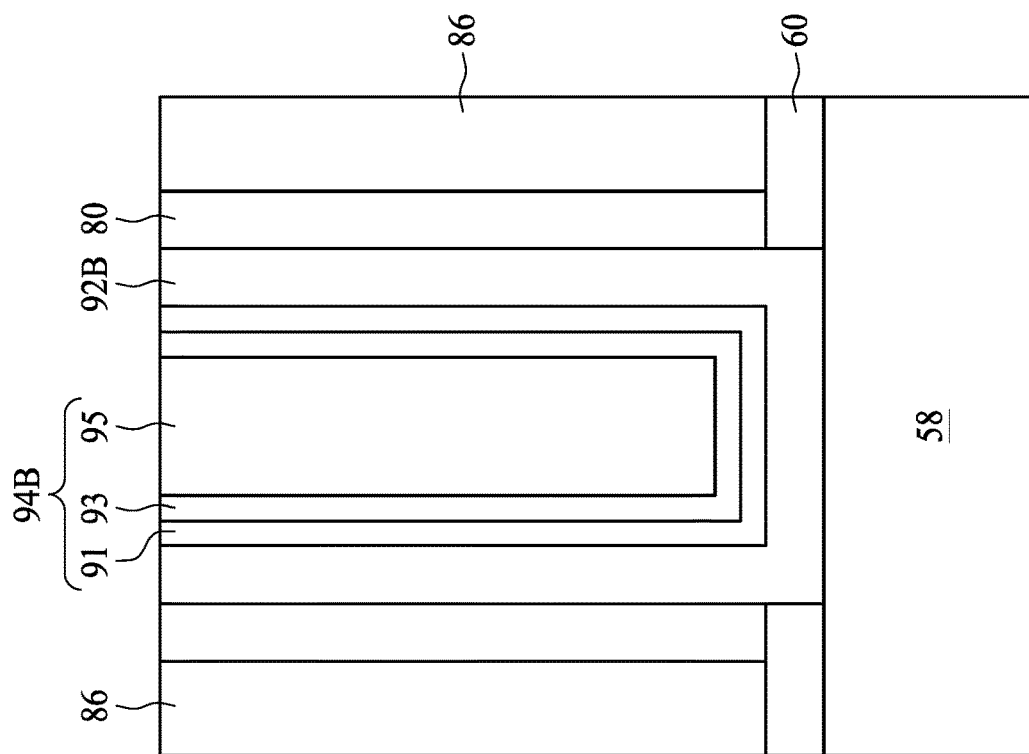

In FIGS. 14A and 14B, gate dielectric layers 92A and 92B, collectively referred to as gate dielectric layers 92, and gate electrodes 94A and 94B, collectively referred to as gate electrodes 94, are formed for replacement gates. FIG. 14C illustrates a detailed view of region 89 of FIG. 14B. To form the gate dielectric layers 92 one or more layers are deposited in the recesses 90A and 90B, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy dielectric layer 60 remains in the recesses 90A and 90B, the gate dielectric layers 92 include a material of the dummy dielectric layer 60 (e.g., SiO$_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94B is illustrated in FIG. 14B, the gate electrode 94B may comprise any number of liner layers 91, any number of work function tuning layers 93, and a fill material 95 as illustrated by FIG. 14C. After the filling of the recesses 90A and 90B, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 15A:
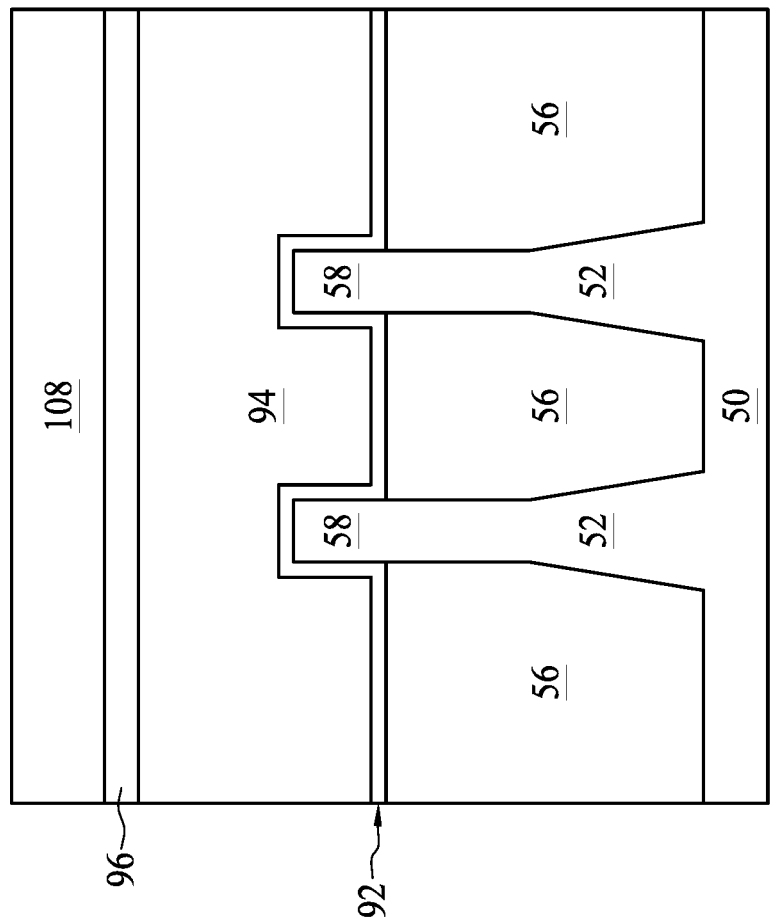
Figure 15B:
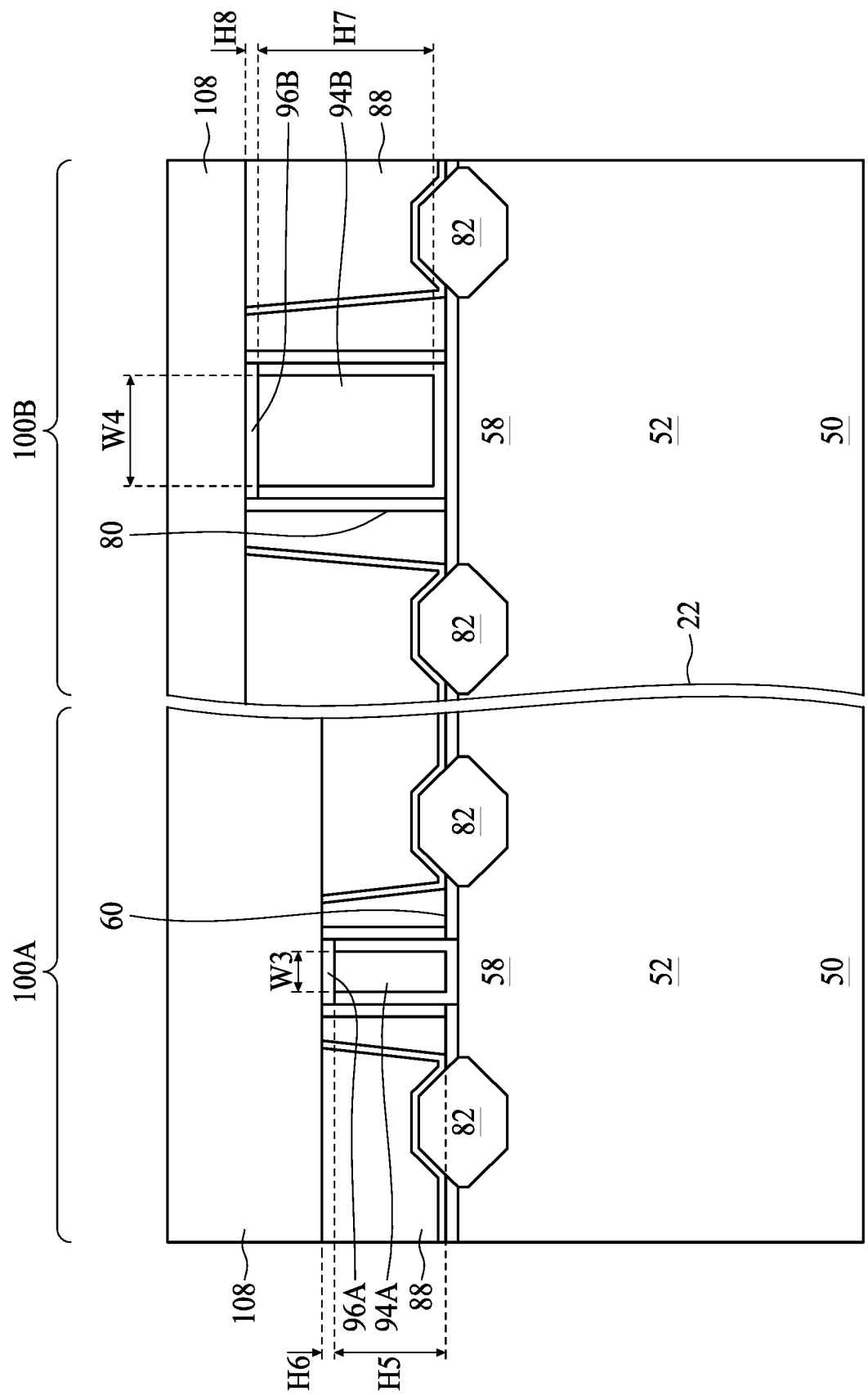

In FIGS. 15A and 15B, gate masks 96A and 96B, collectively referred to as gate masks 96, are formed over the gate stacks (including a gate dielectric layer 92 and a corresponding gate electrode 94), and the gate masks 96 may be disposed between opposing portions of the gate spacers 86. In some embodiments, forming the gate masks 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

In the first gate area 100A, after forming the gate mask 96A, the gate electrode 94A may have a height H5 in a range of 8 nm to 11 nm and a width W3 in a range of 8 nm to 36 nm. The gate mask 96A may have a height H6 in a range of 0.5 nm to 2 nm. In the second gate area 100B, after forming the gate mask 96B, the gate electrode 94B may have a height H7 in a range of 72 nm to 103 nm and a width W4 in a range of 72 nm to 240 nm. The gate mask 96B may have a height H8 in a range of 0.5 nm to 2 nm.

As also illustrated in FIGS. 15A and 15B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 16A and 16B) penetrate through the second ILD 108 and the gate mask 96 to contact the top surface of the recessed gate electrode 94.

Figure 16A:
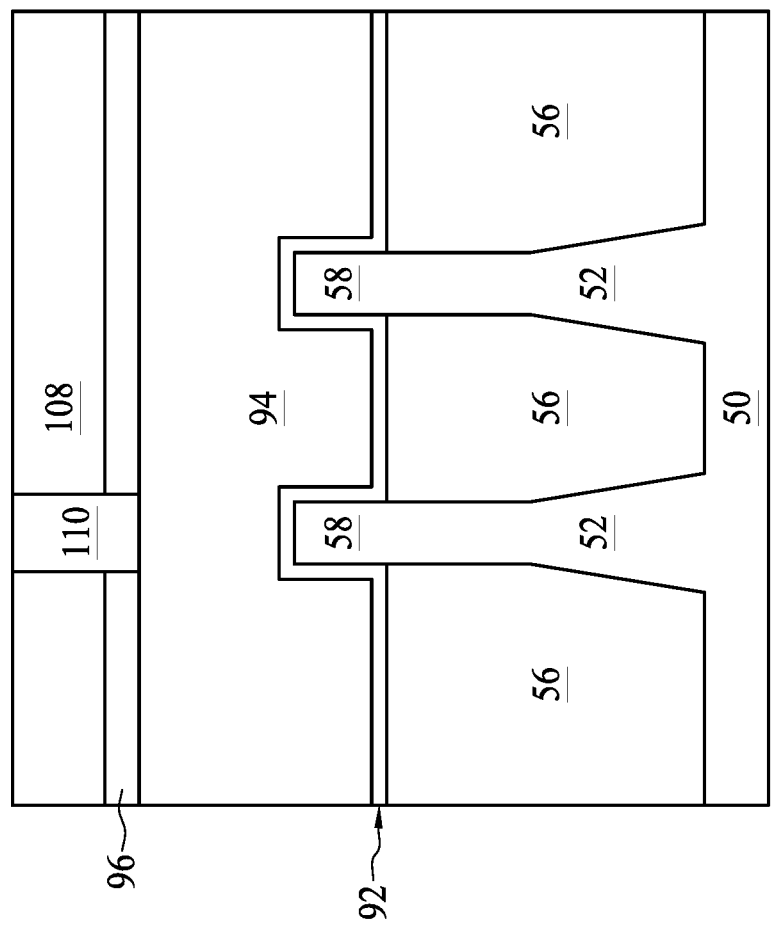
Figure 16B:
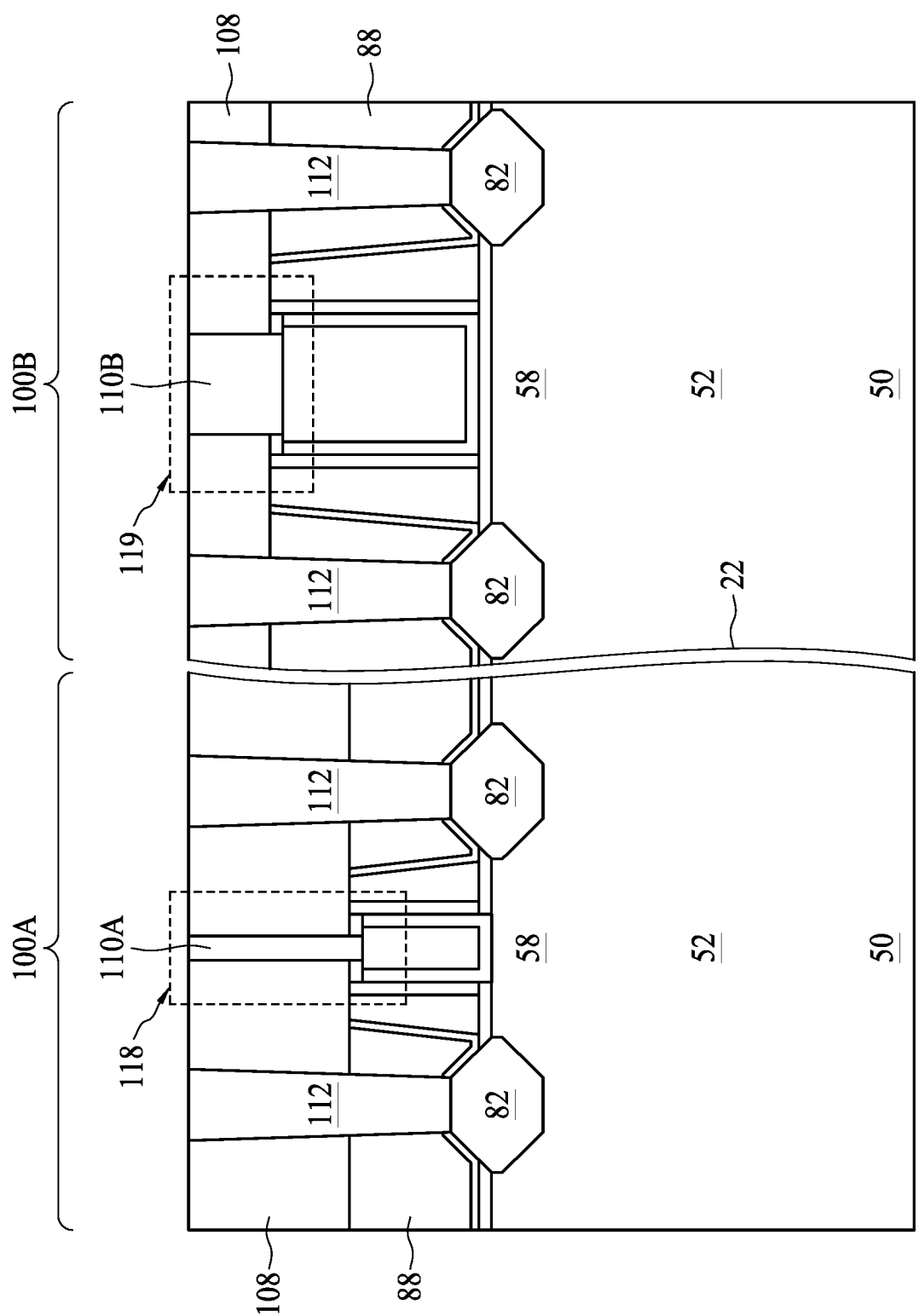
Figure 16C:
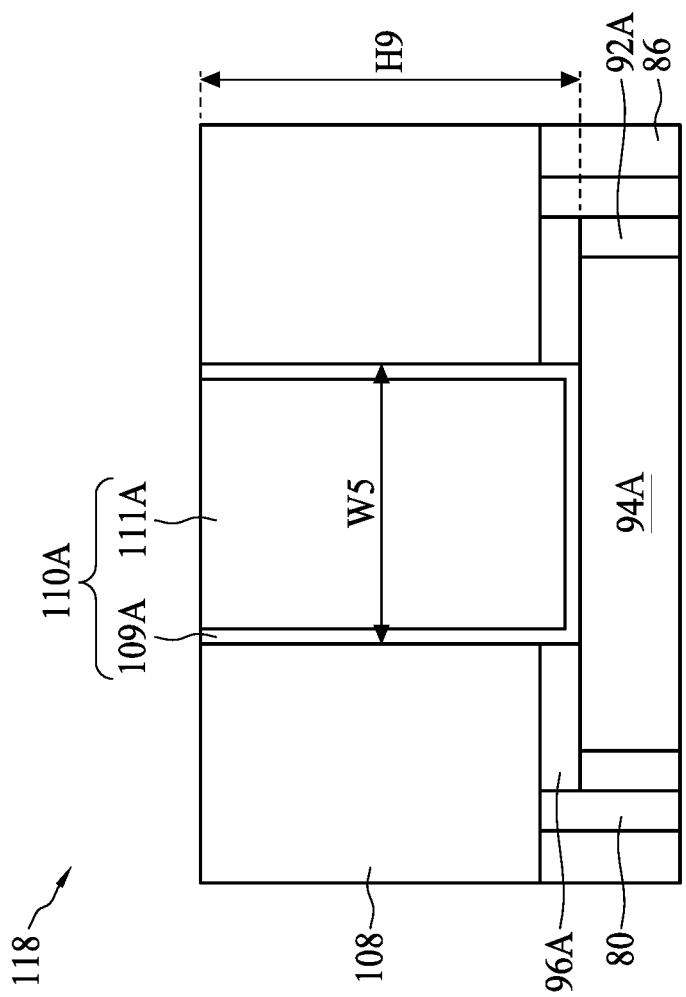
Figure 16D:
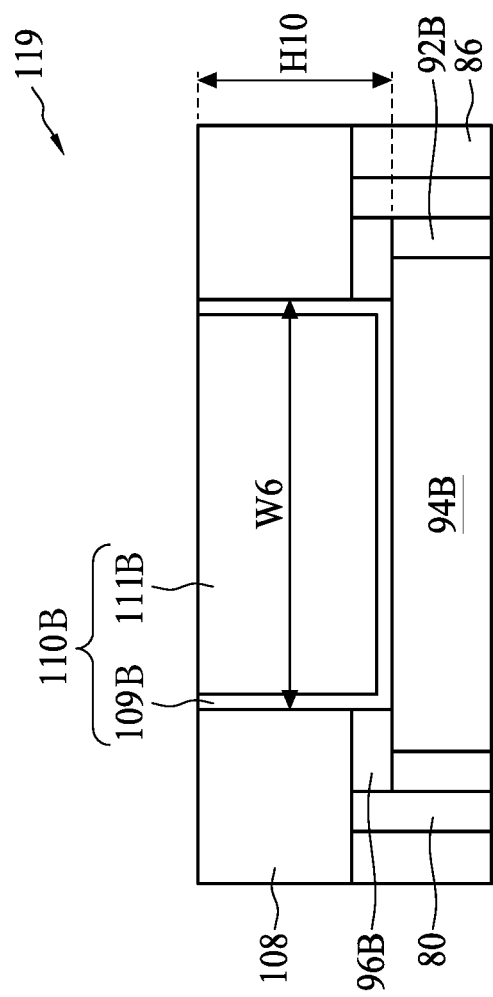

In FIGS. 16A, 16B, and 16C, gate contacts 110A and 110B, collectively referred to as gate contacts 110, and source/drain contacts 112 are formed through the second ILD 108 and the first ILD 88 in accordance with some embodiments, with FIG. 16C illustrating a detailed view of region 118 as shown in FIG. 16B and FIG. 16D illustrating a detailed view of region 119 as shown in FIG. 16B. Openings for the source/drain contacts 112 are formed through the first ILD 88 and second ILD 108. The openings may be formed using acceptable photolithography and etching techniques. A liner (not shown), such as a diffusion barrier layer, an adhesion layer, or the like, and a conductive material may be formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112. An anneal process may be performed to form a silicide at the interface between the epitaxial source/drain regions 82 and the source/drain contacts 112. The source/drain contacts 112 are physically and electrically coupled to the epitaxial source/drain regions 82.

Openings for the gate contacts 110A and 110B are formed through the second ILD 108 and the gate masks 96A and 96B, respectively. The openings may be formed using acceptable photolithography and etching techniques. After forming the openings for the gate contacts 110A and 110B, the openings are first lined with respective liners 109A and 109B. The liners 109A and 109B are formed over bottom surfaces and sidewalls of the openings and may extend over exposed surfaces of the gate electrodes 94A and 94B, the gate masks 96A and 96B, the source/drain contacts 112, and the second ILD 108. The liners 109A and 109B comprise one or more layers of TaN, Ta, TiN, Ti, Co, or the like, or combinations thereof, and may be deposited by any suitable method, for example, CVD, PECVD, PVD, ALD, PEALD, ECP, electroless plating and the like. In some embodiments, the liners 109A and 109B comprise a bottom layer of Ti and a top layer of TiN. In some embodiments, a glue layer (not illustrated) is formed in the openings before forming the liners 109A and 109B. The glue layer may be TiSi and may have a thickness of 9 nm to 10 nm.

After forming the liners 109A and 109B, conductive fill material 111A and 111B for the gate contacts 110A and 110B, respectively, is formed in the openings. The conductive fill material 111A and 111B may be cobalt, copper, a copper alloy, silver, gold, tungsten, aluminum, nickel, or the like. A planarization process, such as a CMP, may be performed to remove excess material from a surface of the second ILD 108. The remaining liners 109A and 109B and conductive fill material 111A and 111B form the gate contacts 110A and 110B and are physically and electrically coupled to the gate electrodes 94A and 94B, respectively.

The gate contact 110A may be formed to a height H9 in a range of 22 nm to 26 nm and to a width W5 in a range of 16 nm to 37 nm. The gate contact 110B may be formed to a height H10 in a range of 16 nm to 20 nm. The gate contact 110B may have a smaller height H10 than the height H9 of the gate contact 110A, which may be due to the gate contact 110A being formed on a taller gate electrode 94B.

The gate contact 110B may be formed to a width W6 in a range of 42 nm to 38 nm, which may be useful in the subsequent formation of a recess with a rivet shape profile in a top surface of the gate contact 110B (see below, FIG. 19B). The smaller height H10 could lead to over-etching of the gate contact 110B in the subsequent formation of the recess with a rivet shape profile. The wider width W6 may lead to the recess having a broader width and a more shallow depth, which may be useful for reducing over-etching of the gate contact 110B. In some embodiments, a ratio of the width W6 to the width W5 is in a range of 1.2 to 2.6, and a ratio of the height H10 to the height H9 is in a range of 1.2 to 1.6.

The gate contact 110B having a width W6 smaller than 42 nm may be disadvantageous because it may lead to over-etching of the gate contact 110B in the subsequent formation of the recess with a rivet shape profile. The gate contact 110B having a width W6 larger than 38 nm may be disadvantageous because it may lead to a shorter height of the gate contact 110B.

The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Figure 17A:
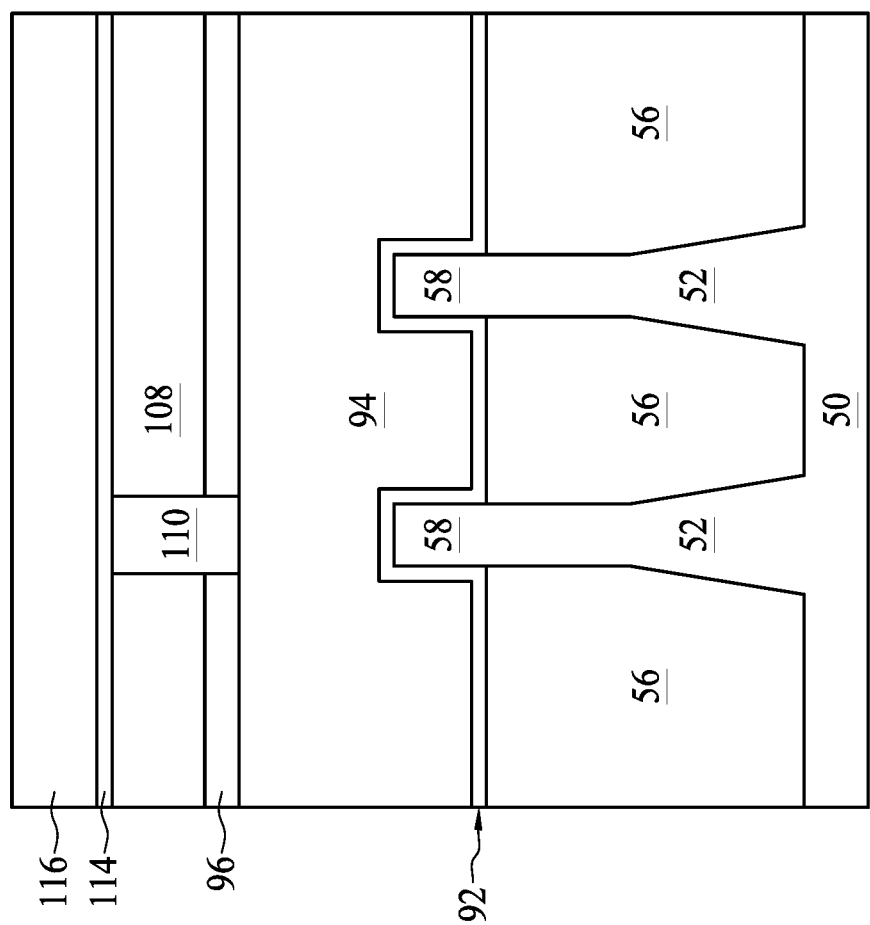
Figure 17B:
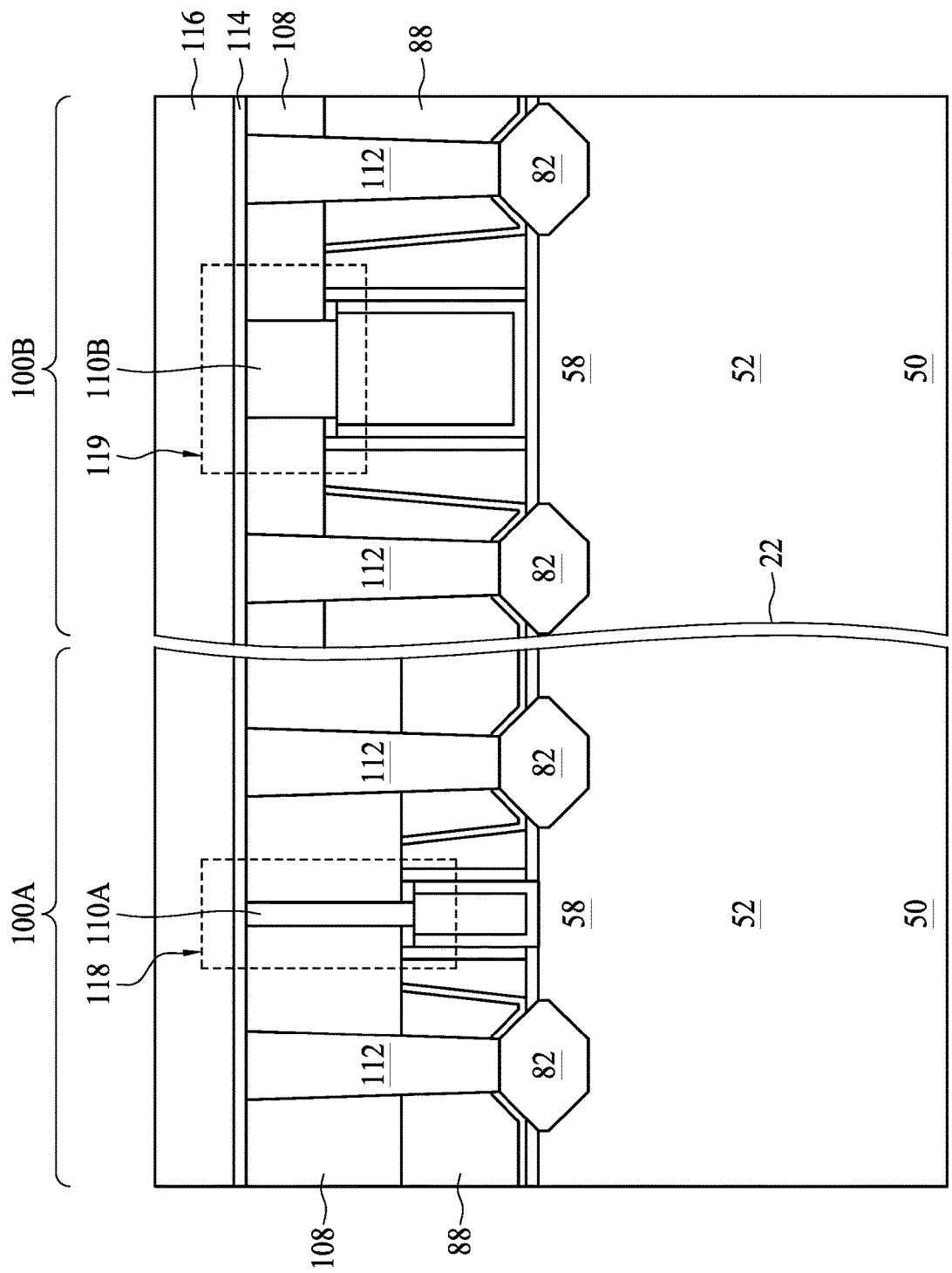

In FIGS. 17A through 17D, a second contact etch stop layer (CESL) 114 and an inter metal dielectric (IMD) 116 are formed. FIG. 17C illustrates a detailed view of region 118 of FIG. 17B, and FIG. 17D illustrates a detailed view of region 119 of FIG. 17B. The second CESL 114 is formed on top surfaces of the second ILD 108, the gate contacts 110, and source/drain contacts 112. The second CESL 114 may comprise or be silicon nitride, silicon carbon nitride, silicon carbon oxide, carbon nitride, aluminum oxide, the like, or a combination thereof, and may be deposited by CVD, plasma enhanced CVD (PECVD), ALD, or another deposition technique.

The IMD 116 is formed on the second CESL 114 and may comprise or be silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, TEOS, a compound thereof, a composite thereof, the like, or a combination thereof. The IMD 116 may be deposited by spin-on, CVD, flowable CVD (FCVD), PECVD, PVD, or another deposition technique.

FIGS. 18A and 18B, following from FIGS. 17C and 17D, respectively, illustrate the formation of openings 124A and 124B through the IMD 116 and second CESL 114 to the gate contacts 110A and 110B. The IMD 116 and second CESL 114 may be patterned to form the openings 124A and 124B, for example, using photolithography and one or more etch processes. The etch process may be a dry etch and may include a reactive ion etch (RIE), neutral beam etch (NBE), inductively coupled plasma (ICP) etch, capacitively coupled plasma (CCP) etch, ion beam etch (IBE), the like, or a combination thereof. The etch process may be anisotropic. In some embodiments, the etching process can include a plasma using a first gas comprising carbon tetrafluoride ($CF_4$), methane ($CH_4$), hexafluoroethane ($C_2F_6$), octafluoropropane ($C_3F_8$), fluoroform ($CHF_3$), difluoromethane ($CH_2F_2$), fluoromethane ($CH_3F$), a carbon fluoride (e.g., $C_xF_y$, where x can be in a range from 1 to 5 and y can be in a range from 4 to 8), the like, or a combination thereof. The plasma can further use a second gas comprising nitrogen ($N_2$), hydrogen ($H_2$), oxygen ($O_2$), argon (Ar), xenon (Xe), helium (He), carbon monoxide (CO), carbon dioxide ($CO_2$), carbonyl sulfide (COS), the like, or a combination thereof. An inert gas may be optionally supplied during the etching process. In some embodiments, the openings 124A are formed to a width W7 in a range of 17 nm to 23 nm, and the openings 124B are formed to a width W8 in a range of 37 nm to 43 nm.

FIGS. 18A and 18B further illustrate the formation of residual regions 126A and 126B on top surfaces of the gate contacts 110A and 110B, respectively. The residual regions 126A and 126B are formed by the reaction of the top surfaces of the gate contacts 110A and 110B with etchants from the formation the openings 124A and 124B. In some embodiments, the etchants may comprise fluorine and the material of the residual regions 126A and 126B may comprise a water-soluble metal fluoride such as, e.g. cobalt fluoride.

FIGS. 19A and 19B illustrate the formation of recesses 128A and 128B in top surfaces of the gate contacts 110A and 110B, respectively. After the openings 124A and 124B are formed, a wet etch such as a wet cleaning process may be performed to remove the residual regions 126A and 126B from the gate contacts 110A and 110B. The wet cleaning process is performed to efficiently remove the residual regions 126A and 126B from the surfaces of the gate contacts 110A and 110B and to remove etching byproducts on the sidewalls of the IMD 116. The recesses 128A and 128B may extend into respective top surfaces of the gate contacts 110A and 110B after the wet cleaning process removes the residual regions 126A and 126B.

In an embodiment, the wet cleaning process can include immersing the semiconductor substrate 50 (see above, FIGS. 17A and 17B) in deionized (DI) water or another suitable chemical (which may be diluted in DI water). In another embodiment, the wet cleaning process uses ammonium hydroxide. In an embodiment wherein the gate contacts 110 are fabricated from Co containing materials, DI water may efficiently dissolve the residual material which may be a water-soluble metal fluoride such as e.g. cobalt fluoride, thus removing the material of the residual regions 126A and 126B and forming the recesses 128A and 128B on the gate contacts 110A and 110B. In other embodiments, a chemical etchant which reacts with the material of the gate contacts 110 may be utilized. The recesses 128A and 128B may be formed as a concave surface (e.g., an upper concave surface on the gate contacts 110) having tip ends 129A and 129B formed under a bottom surface of the second CESL 114. As the wet cleaning process is an isotropic etching process, the chemical reaction between the solution and the gate contacts 110 isotropically and continuously occurs when the solution contacts the gate contacts 110 until a predetermined process time period is reached. The tip ends 129A and 129B of the recesses 128A and 128B, respectively, extend laterally from the gate contacts 110A and 110B and further extend underneath the bottom surface of the second CESL 114. The tip ends 129A and 129B may assist the materials subsequently formed therein to anchor and engage in the vias 120 with better adhesion and clinch, as well as catching slurry used in subsequent CMP processes (may also be referred to as CMP slurry) and reducing the amount of CMP slurry reaching the gate contacts 110A and 110B, thereby reducing further etching of the gate contacts 110A and 110B.

Because the width W6 of the gate contact 110B is larger than the width W5 of the gate contact 110A, the isotropic etching process may form the recess 128A to a larger depth D1 than the depth D2 of the recess 128B, and it may form the recess 128A to a smaller width W9 than the width W10 of the recess 128B. The depth D2 being smaller than the depth D1 may be useful because the height H8 of the gate contact 110B is smaller than the height H7 of the gate contact 110A and achieving a smaller depth D2 of the recess 128B may reduce over-etching of the recess 128B through the gate contact 110B into the gate electrode 94B. This may be useful for reducing contact resistance and increasing yield gain for high bandwidth memory.

In some embodiments, the depth D1 of the recess 128A is in a range of 6 nm to 14 nm, which may be useful for achieving a wide enough rivet-shaped bottom portion of a subsequently formed conductive contact (see below, FIG. 20A) to catch slurry used in subsequent CMP processes. The depth D1 being less than 6 nm may be disadvantageous because the subsequently formed conductive contact may not be wide enough to catch slurry used in subsequent CMP processes, leading to undesirable etching of the gate contact 110A. The depth D1 being greater than 14 nm may be disadvantageous because the subsequently formed conductive contact may have an undesirably large width, which may lead to shorts with source/drain regions 82 or source/drain contacts 112 (see above, FIG. 17B).

In some embodiments, the depth D2 of the recess 128B is in a range of 6 nm to 10 nm, which may be useful for achieving a wide enough rivet-shaped bottom portion of a subsequently formed conductive contact (see below, FIG. 20A) to catch slurry used in subsequent CMP processes without undesirable over-etching of the gate contact 110B. The depth D2 being less than 6 nm may be disadvantageous because the subsequently formed conductive contact may not be wide enough to catch slurry used in subsequent CMP processes, leading to undesirable etching of the gate contact 110B. The depth D2 being greater than 10 nm may be disadvantageous because the gate contact 110B may be over-etched, leading to greater contact resistance and worse device performance. In some embodiments, a width W9 of the recess 128A is in a range of 0.4 nm to 3.2 nm.

Figures 20A, 20B:
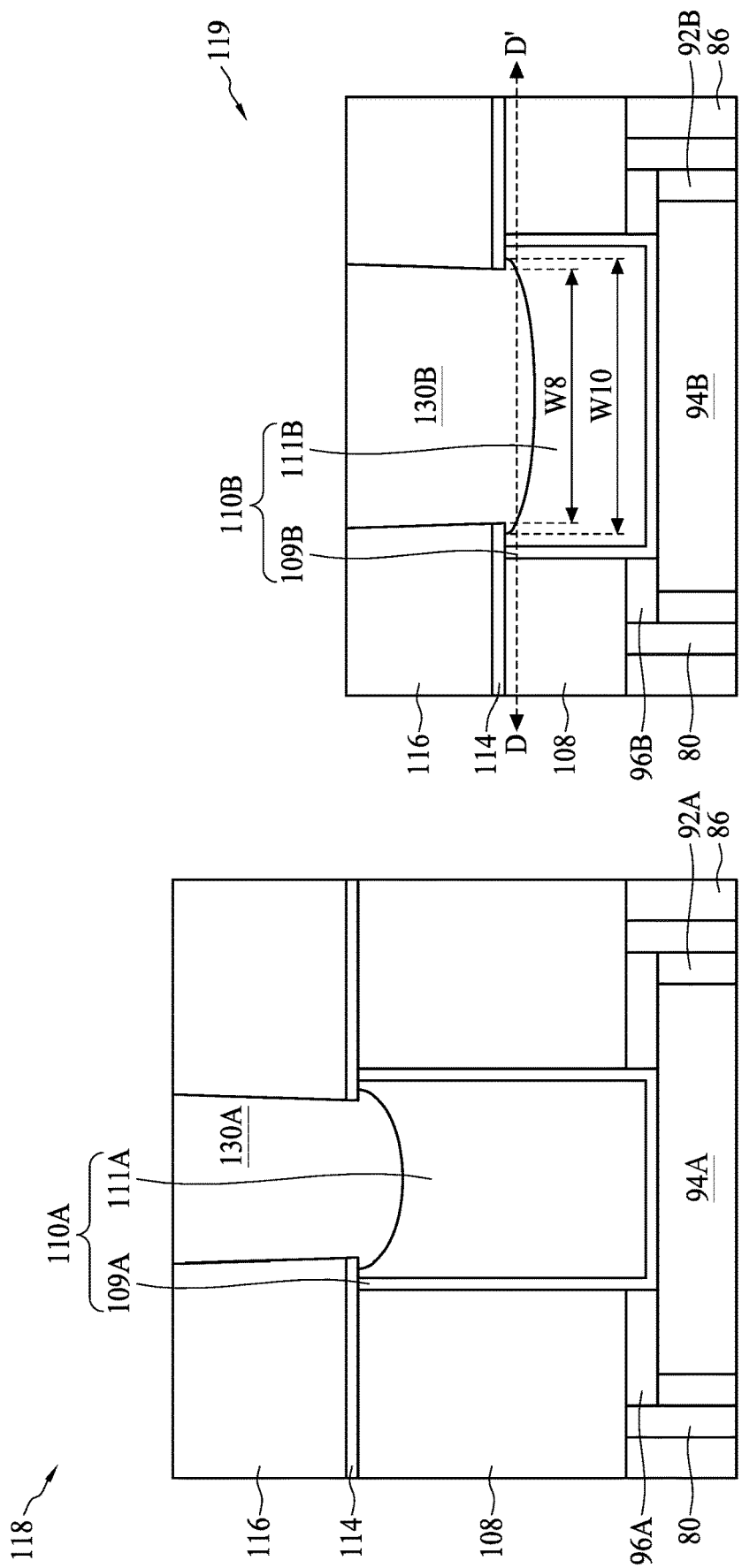

In FIGS. 20A and 20B, which follow from FIGS. 19A and 19B, respectively, conductive features 130A and 130B are formed in the recess 128A and the opening 124A and the recess 128B and the opening 124B, respectively, in connection with the gate contacts 110A and 110B, respectively. In some embodiments, the conductive features 130A and 130B are formed with a conductive fill material comprising tungsten that is deposited with an ALD process. A precursor comprising tungsten and fluorine may be used for the selective ALD, such as e.g. $WF_6$. In other embodiments, the conductive features 130A and 130B can be formed by CVD, electroless deposition (ELD), PVD, electroplating, or another deposition technique. The conductive features 130A and 130B may be or comprise tungsten, cobalt, copper, ruthenium, aluminum, gold, silver, alloys thereof, the like, or a combination thereof. When the conductive features 130A and 130B substantially fill the recesses 128A and 128B and the openings 124A and 124B, respectively, the deposition process is then terminated. The excess of conductive features 130A and 130B outgrown from the openings 124A and 124B may be removed by using a planarization process such as a CMP, for example. The planarization process may remove excess conductive feature 130A and 130B from above a top surface of the IMD 116. Hence, top surfaces of the conductive features 130A and 130B and the IMD 116 may be coplanar. The conductive features 130A and 130B may be or may be referred to as contacts, plugs, metal plugs, conductive lines, conductive pads, vias, via-to-interconnect layer (Vo), etc. A larger contact area on the bottom surface of the conductive features 130A and 130B may result in lower contact resistance, improving device functioning.

In order to make it easier to fill the openings 124A and 124B, the conductive features 130A and 130B may be formed without a barrier layer or an adhesion layer. Therefore, adhesion between the conductive features 130A and 130B and the IMD 116 may degrade, and tiny cracks may exist between the conductive features 130A and 130B and the IMD 116. During the CMP process, the slurry used in the CMP process (may also be referred to as CMP slurry) may seep down through the cracks and reach the gate contacts 110A and 110B. The slurry may have a high etch selectivity (e.g., having a high etch rate) for the material (e.g., cobalt) of the gate contacts 110A and 110B, and therefore, may cause the upper surfaces of the conductive features 130A and 130B to recess, thereby causing unreliable electrical connection between the conductive features 130A and 130B and the underlying gate contacts 110A and 110B. By filling the recesses 128A and 128B with respective tip ends 129A and 129B (see above, FIGS. 19A and 19B), the conductive features 130A and 130B may comprise rivet-shaped bottom portions extending into top surfaces of the respective gate contacts 110A and 110B. The enlarged rivet-shaped bottom portions of the conductive features 130A and 130B may catch the CMP slurry seeping down the cracks and may reduce the amount of CMP slurry reaching the gate contacts 110A and 110B, thereby reducing or preventing recessing of the gate contacts 110A and 110B.

In some embodiments, a ratio of a width W10 measured across opposing outer sidewalls of the rivet-shaped bottom portion of the conductive feature 130B to the width W8 measured across opposing inner sidewalls of the conductive feature 130B is in a range of 1.2 to 1.5, which may be advantageous for catching the CMP slurry seeping down the cracks and thereby reducing or preventing recessing of the gate contacts 110B. The ratio of the width W10 to the width W8 being smaller than 1.2 may be disadvantageous for not catching the CMP slurry seeping down the cracks and thereby increasing recessing of the gate contacts 110B. The ratio of the width W10 to the width W8 being greater than 1.5 may be disadvantageous because it may lead to shorts between adjacent gate contacts 110B and source/drain contacts 112.

Figure 20C:
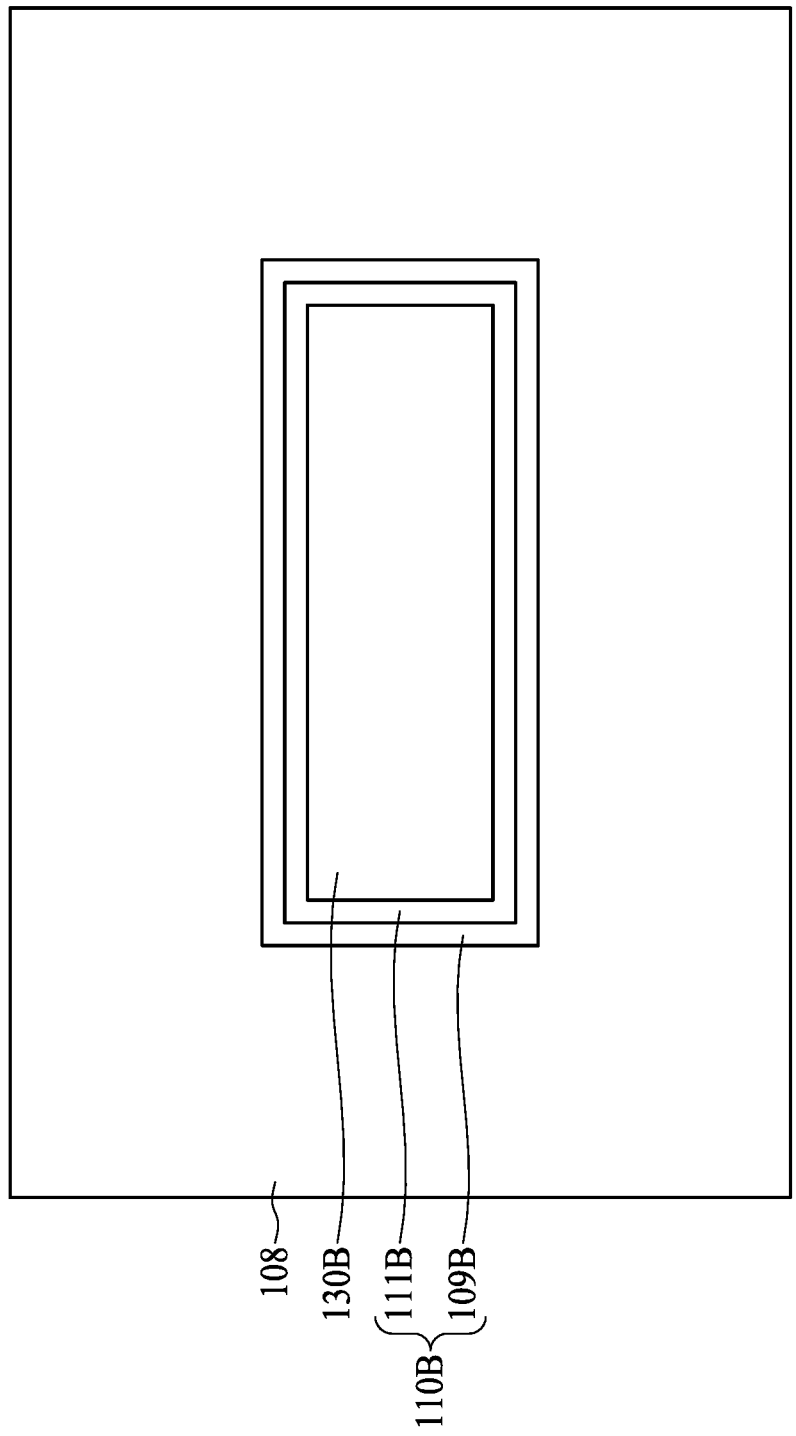
FIGS. 20C, 20D, 20E, and 20F are top views of intermediate stages in the manufacturing of FinFETs, in accordance with some embodiments.
Figure 20D:
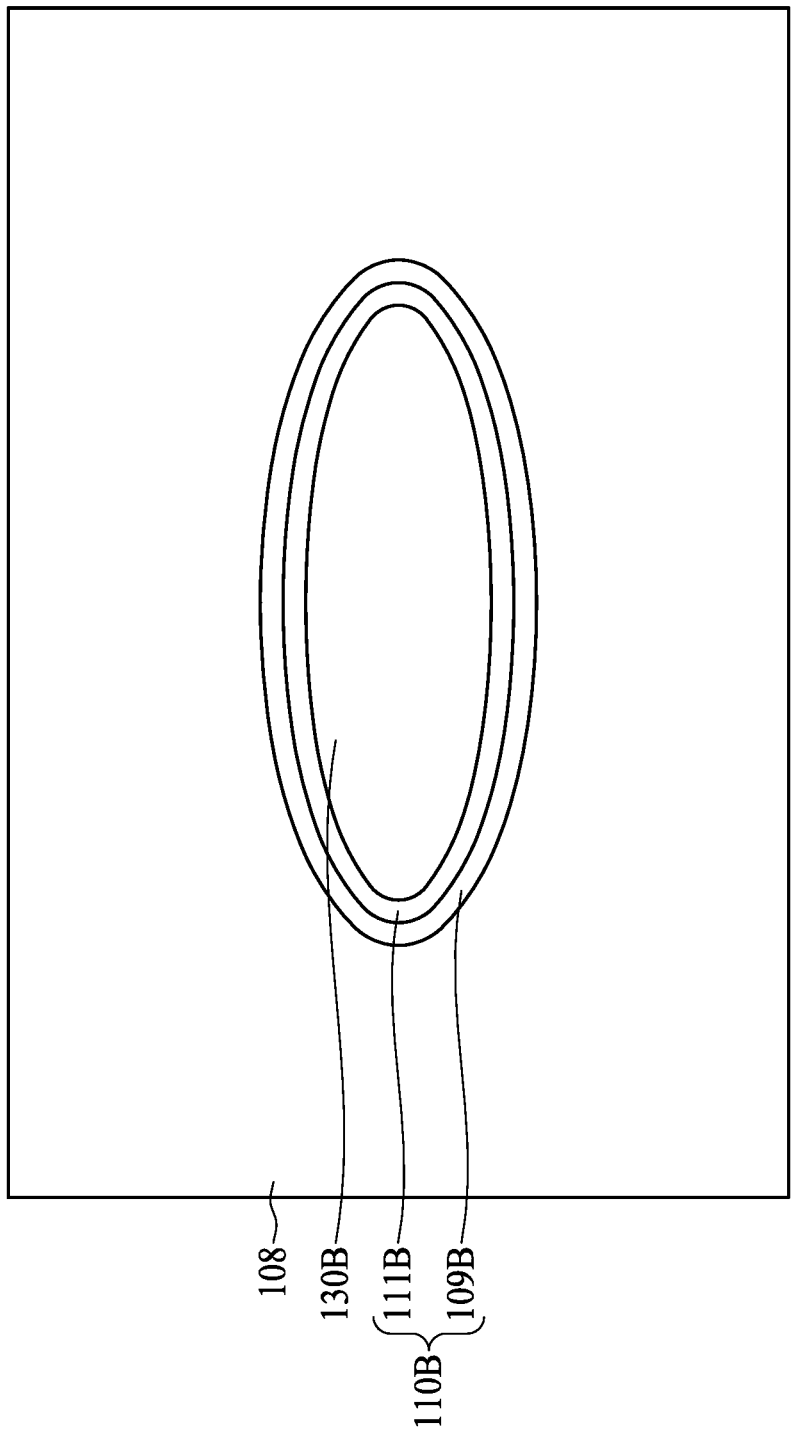
Figure 20E:
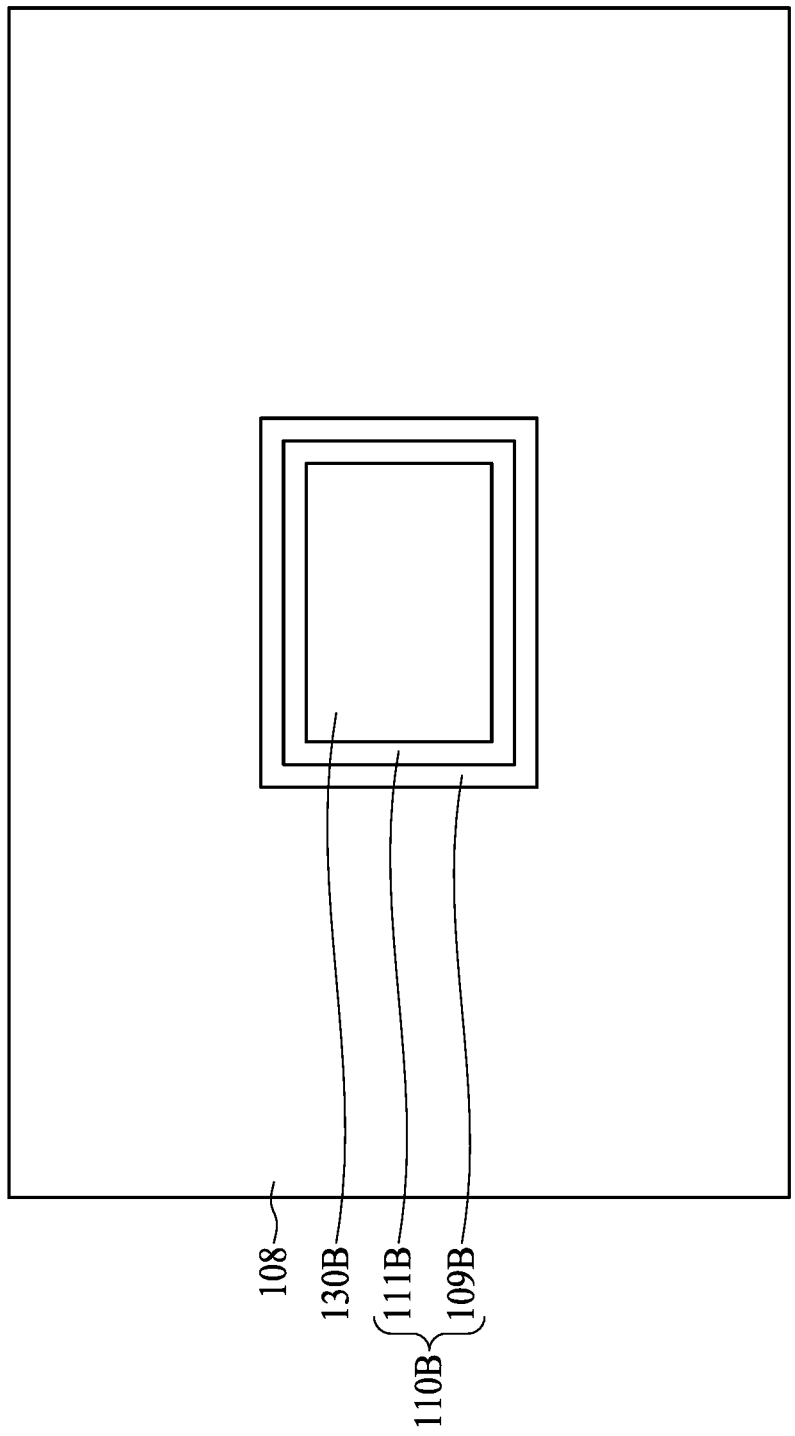
Figure 20F:
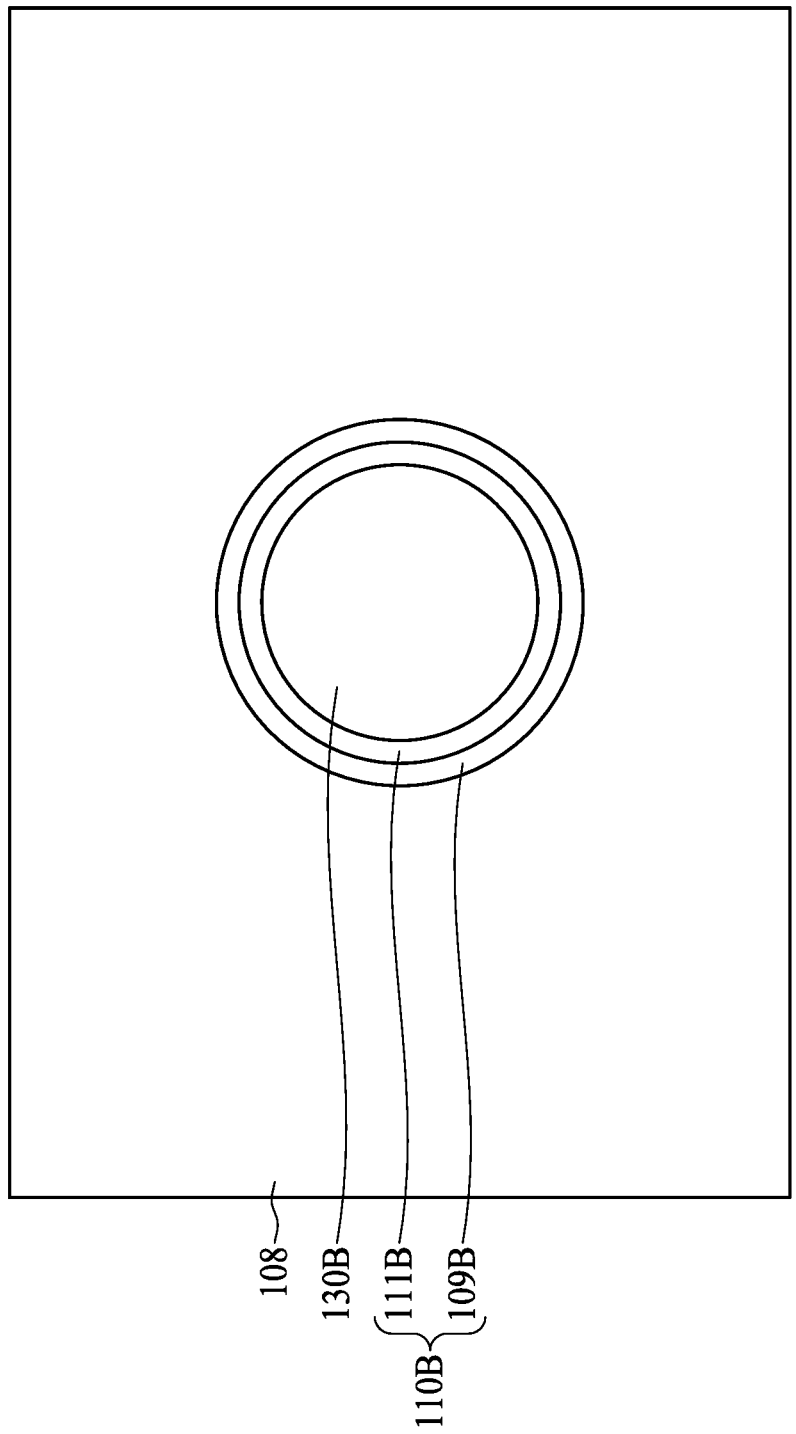

FIGS. 20C through 20F illustrate top views of the structure through cross section D-D' as shown in FIG. 20B, in accordance with some embodiments. FIG. 20C illustrates an embodiment in which the gate contact 110B and the conductive feature 130B comprise rectangular profiles, wherein the conductive feature 130B surrounds the gate contact 110B. FIG. 20D illustrates an embodiment in which the gate contact 110B and the conductive feature 130B comprise ovular profiles, wherein the conductive feature 130B surrounds the gate contact 110B. FIG. 20E illustrates an embodiment in which the gate contact 110B and the conductive feature 130B comprise square profiles, wherein the conductive feature 130B surrounds the gate contact 110B. FIG. 20F illustrates an embodiment in which the gate contact 110B and the conductive feature 130B comprise circular profiles, wherein the conductive feature 130B surrounds the gate contact 110B. However, as one having ordinary skill in the art will recognize, the top view profiles of the gate contact 110B and the conductive feature 130B described above are merely examples and are not meant to limit the current embodiments. Any suitable profiles may be used, and all such profiles are fully intended to be included within the scope of the embodiments discussed herein.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Embodiments may provide advantages. A gate contact is formed on a gate structure and a contact plug is subsequently formed on the gate contact. The gate contact has a larger width than the contact plug, and a rivet-shaped bottom portion of the contact plug extends into the gate contact. The rivet-shaped bottom portion of the contact plug may reduce undesirable etching of the gate contact by slurry from a subsequently performed CMP. The gate contact having a larger width than the contact plug may allow the rivet-shaped bottom portion of the contact plug to be wider and shallower, which may reduce undesirable contact resistance and improve yield gain for high bandwidth memory.

In accordance with an embodiment, a semiconductor device includes: a first gate electrode on a substrate; a second gate electrode on the substrate; a first conductive contact on the first gate electrode, the first conductive contact having a first height and a first width; a second conductive contact on the second gate electrode, the second conductive contact having a second height and a second width, the second height being smaller than the first height, the second width being greater than the first width; an etch stop layer (ESL) on the first conductive contact and the second conductive contact; a third conductive contact extending through the ESL, the ESL overhanging a portion of the third conductive contact, a convex bottom surface of the third conductive contact physically contacting a concave top surface of the first conductive contact, the third conductive contact having a third width measured at a bottom surface of the ESL; and a fourth conductive contact extending through the ESL, the ESL overhanging a portion of the fourth conductive contact, a convex bottom surface of the fourth conductive contact physically contacting a concave top surface of the second conductive contact, the fourth conductive contact having a fourth width measured at the bottom surface of the ESL, the fourth width being greater than the third width. In an embodiment, the first conductive contact and the second conductive contact include cobalt. In an embodiment, the third conductive contact and the fourth conductive contact include tungsten. In an embodiment, the semiconductor device further includes a dielectric layer between the second gate electrode and the ESL. In an embodiment, a portion of the second conductive contact is interposed between the dielectric layer and the fourth conductive contact.

In accordance with another embodiment, a semiconductor device includes: a first channel region on a semiconductor substrate; a second channel region on the semiconductor substrate; a first gate structure on the first channel region, the first gate structure including a first gate electrode, the first gate electrode having a first height; a second gate structure on the second channel region, the second gate structure including a second gate electrode, the second gate electrode having a second height, the second height being greater than the first height; a first dielectric layer on the first gate structure and the second gate structure; a first conductive contact on the first gate electrode, the first conductive contact extending to a top surface of the first dielectric layer; a second conductive contact on the second gate electrode, the second conductive contact extending to the top surface of the first dielectric layer; an etch stop layer (ESL) on the first dielectric layer, the ESL covering a portion of the first conductive contact and a portion of the second conductive contact; a third conductive contact, including: a first bottom portion below a lower surface of the ESL, the first bottom portion being surrounded by the first conductive contact in a top view, the first bottom portion extending under the lower surface of the ESL, the first bottom portion having a third width; and a first top portion above the lower surface of the ESL; and a fourth conductive contact, including: a second bottom portion below the lower surface of the ESL, the second bottom portion being surrounded by the second conductive contact in the top view, the second bottom portion extending under the lower surface of the ESL, the second bottom portion having a fourth width, the fourth width being greater than the third width; and a second top portion above the lower surface of the ESL. In an embodiment, the second conductive contact includes a liner and a conductive fill material. In an embodiment, the liner includes titanium. In an embodiment, the conductive fill material includes cobalt. In an embodiment, a portion of the conductive fill material is interposed between the liner and the fourth conductive contact.

In accordance with yet another embodiment, a method of forming a semiconductor device includes: depositing a first dielectric layer on a first gate electrode and a second gate electrode, the first gate electrode and the second gate electrode extending from a substrate; forming a first conductive material through the first dielectric layer, a first portion of the first conductive material having a first height and a first width, a second portion of the first conductive material having a second height and a second width, the first height being greater than the second height, the second width being greater than the first width; forming an etch stop layer (ESL) over the first conductive material and the first dielectric layer; depositing a second dielectric layer on the ESL; etching a first opening through the second dielectric layer and the ESL, the first opening extending into the first portion of the first conductive material, the first opening being surrounded by the second portion of the first conductive material in a top view, the ESL overhanging a portion of the first opening; etching a second opening through the second dielectric layer and the ESL, the second opening extending into the second portion of the first conductive material, the second opening being surrounded by the first conductive material in the top view, the ESL overhanging a portion of the first opening; and filling the first opening and the second opening with a second conductive material. In an embodiment, the first conductive material includes cobalt. In an embodiment, the second conductive material includes tungsten. In an embodiment, etching the first opening and the second opening includes a dry etch and a wet etch. In an embodiment, the dry etch includes fluorine. In an embodiment, the fluorine reacts with a top surface of the first conductive material to form a residual region including a water-soluble fluoride. In an embodiment, the wet etch is a wet cleaning process including deionized (DI) water. In an embodiment, the DI water removes the residual region. In an embodiment, the first opening extends into the first portion of the first conductive material below a bottom surface of the ESL to a first depth in a range of 6 nm to 14 nm. In an embodiment, the second opening extends into the second portion of the first conductive material below a bottom surface of the ESL to a second depth in a range of 6 nm to 10 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first gate electrode on a substrate;
   a first conductive contact on the first gate electrode;
   an etch stop layer (ESL) on the first conductive contact; and
   a second conductive contact extending through the ESL, a convex bottom surface of the second conductive contact physically contacting a concave top surface of the first conductive contact, wherein the convex bottom surface of the second conductive contact extends directly under the ESL.

2. The semiconductor device of claim 1 further comprising:
   a second gate electrode on the substrate;
   a third conductive contact on the second gate electrode, wherein the third conductive contact is wider than the first conductive contact, and wherein the ESL is disposed on the third conductive contact; and
   a fourth conductive contact extending through the ESL, a convex bottom surface of the fourth conductive contact physically contacting a concave top surface of the third conductive contact, wherein the convex bottom surface of the fourth conductive contact extends directly under the ESL.

3. The semiconductor device of claim 2, wherein the first conductive contact is longer than the third conductive contact.

4. The semiconductor device of claim 2, wherein the convex bottom surface of the fourth conductive contact is wider than the convex bottom surface of the second conductive contact.

5. The semiconductor device of claim 2, wherein a depth that the fourth conductive contact extends into the third conductive contact is smaller than a depth that the second conductive contact extends into the first conductive contact.

6. The semiconductor device of claim 1, wherein the first conductive contact comprises cobalt, and wherein the second conductive contact comprises tungsten.

7. A semiconductor device, comprising:
   a first gate electrode and a second gate electrode on a semiconductor substrate;
   a first dielectric layer over the first gate electrode and the second gate electrode;
   a first gate contact in the first dielectric layer and electrically connected to the first gate electrode;
   a second gate contact in the first dielectric layer and electrically connected to the second gate electrode, wherein the second gate contact is wider than the first gate contact;
   a second dielectric layer over the first dielectric layer;
   a first conductive feature extending through the second dielectric layer into the first gate contact, wherein the first conductive feature has a first convex bottom surface; and
   a second conductive feature extending through the second dielectric layer into the second gate contact, wherein the second conductive feature has a second convex bottom surface that is wider than the first convex bottom surface.

8. The semiconductor device of claim 7, further comprising an etch stop layer (ESL) between the first dielectric layer and the second dielectric layer, wherein the first conductive feature and the second conductive feature each extend through the ESL, and wherein the ESL overhangs the first convex bottom surface and the second convex bottom surface.

9. The semiconductor device of claim 8, wherein a width of the second conductive feature in the ESL is greater than a width of the first conductive feature in the ESL.

10. The semiconductor device of claim 7, Wherein the second gate electrode is taller than the first gate electrode.

11. The semiconductor device of claim 7, wherein the first conductive feature extends further into the first gate contact than the second conductive feature extends into the second gate contact.

12. The semiconductor device of claim 7, wherein a ratio of a width of the second convex bottom surface to a width of the first convex bottom surface is in a range of 1.2 to 1.5.

13. A method comprising:
    forming a first gate contact and a second gate contact in a first dielectric layer over a substrate, the first gate contact being electrically connected to a first gate electrode, and second gate contact being electrically connected to a second gate electrode;
    depositing an etch stop layer (ESL) over the first dielectric layer;
    dry etching the ESL to form a first opening exposing the first gate contact and a second opening exposing the second gate contact, the second opening being wider than the first opening;
    wet etching the first gate contact and the second gate contact through the first opening and the second opening to extend the first opening into the first gate contact and the second opening into the second gate contact; and
    filling the first opening and the second opening with a conductive material to define a first contact structure extending into the first gate contact and a second contact structure extending into the second gate contact.

14. The method of claim 13, wherein dry etching the ESL forms a first residual region in the first gate contact and a second residual region in the second gate contact, and wherein wet etching the first gate contact and the second gate contact comprises removing the first residual region and the second residual region.

15. The method of claim 14, wherein dry etching the ESL comprises a fluorine-based etch, and wherein the first residual region and the second residual region each comprises a water-soluble metal fluoride.

16. The method of claim 15, wherein wet etching the first gate contact and the second gate contact comprises immersing the substrate in deionized water or a solution comprising deionized water.

17. The method of claim 15, wherein wet etching the first gate contact and the second gate contact comprises etching with ammonium hydroxide.

18. The method of claim 15, wherein after wet etching the first gate contact and the second gate contact, a bottom surface of the first opening is convex and a bottom surface of the second opening is convex.

19. The method of claim 15, wherein filling the first opening and the second opening with the conductive material comprises filling the first opening and the second opening with the conductive material without forming a barrier layer or an adhesion layer in the first opening or the second opening.

20. The method of claim 15, wherein the first opening and the second opening each undercut the ESL after wet etching the first gate contact and the second gate contact.

\* \* \* \* \*